United States Patent
Feng et al.

(10) Patent No.: US 11,263,942 B2
(45) Date of Patent: Mar. 1, 2022

(54) SHIFT REGISTER UNIT AND DRIVING METHOD THEREOF, GATE DRIVING CIRCUIT, AND DISPLAY DEVICE

(71) Applicants: Hefei Xinsheng Optoelectronics Technology Co., Ltd., Anhui (CN); BOE Technology Group Co., Ltd., Beijing (CN)

(72) Inventors: Xuehuan Feng, Beijing (CN); Yongqian Li, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 311 days.

(21) Appl. No.: 16/607,156

(22) PCT Filed: May 7, 2019

(86) PCT No.: PCT/CN2019/085872
§ 371 (c)(1),
(2) Date: Oct. 22, 2019

(87) PCT Pub. No.: WO2020/019819
PCT Pub. Date: Jan. 30, 2020

(65) Prior Publication Data
US 2021/0358365 A1    Nov. 18, 2021

(30) Foreign Application Priority Data
Jul. 25, 2018    (CN) .......................... 201810828750.6

(51) Int. Cl.
*G09G 3/36* (2006.01)
*G09G 3/20* (2006.01)
*G11C 19/28* (2006.01)

(52) U.S. Cl.
CPC .............. *G09G 3/20* (2013.01); *G11C 19/287* (2013.01); *G09G 2310/0286* (2013.01); *G09G 2310/061* (2013.01); *G09G 2310/08* (2013.01)

(58) Field of Classification Search
CPC ........ G11C 19/287; G11C 19/00; G09G 3/32; G09G 3/3266; G09G 2310/0286;
(Continued)

(56) References Cited

U.S. PATENT DOCUMENTS 9,384,853 B2    7/2016  Jang
9,875,712 B2    1/2018  Ma et al.
(Continued)

FOREIGN PATENT DOCUMENTS

CN    101242178 A    8/2008
CN    104021753 A    9/2014
(Continued)

OTHER PUBLICATIONS

Sep. 29, 2019—(CN) First Office Action Appn 201810828750.6 with English Translation.
(Continued)

*Primary Examiner* — Pegeman Karimi
(74) *Attorney, Agent, or Firm* — Banner & Witcoff, Ltd.

(57) ABSTRACT

A shift register unit and a driving method thereof, a gate driving circuit, and a display device are provided. A shift register unit includes a blanking input circuit, a display input circuit, an output circuit; the blanking input circuit is configured to input a blanking control signal to a first node during a blanking period in response to a blanking input signal, the blanking input circuit includes a charging sub-circuit, the charging sub-circuit is configured to input the blanking control signal to a control node in response to a first compensation control signal and a second compensation control signal, the display input circuit is configured to input
(Continued)

a display control signal to the first node during a display period in response to a display input signal; the output circuit is configured to output a composite output signal to an output end under control of a level of the first node.

20 Claims, 17 Drawing Sheets

(58) Field of Classification Search
CPC .... G09G 2320/0233; G09G 3/36; G09G 5/00; G06F 3/038; G02F 1/1345
See application file for complete search history.

(56) References Cited

U.S. PATENT DOCUMENTS

| | | |
|---|---|---|
| 9,886,891 B2 | 2/2018 | In et al. |
| 10,170,069 B2 | 1/2019 | Xue et al. |
| 10,217,428 B2 | 2/2019 | Fan et al. |
| 10,297,204 B2 | 5/2019 | Gu et al. |
| 10,706,947 B2 | 7/2020 | Zhang et al. |
| 10,950,196 B2 | 3/2021 | Du et al. |
| 2007/0274433 A1* | 11/2007 | Tobita .................. G09G 3/3677 377/64 |
| 2011/0069044 A1* | 3/2011 | Lee .................. G11C 19/28 345/204 |
| 2011/0122988 A1 | 5/2011 | Miyayama et al. |
| 2012/0162170 A1 | 6/2012 | Ochiai et al. |
| 2014/0111495 A1* | 4/2014 | Iwase .................. G09G 3/3677 345/211 |
| 2016/0351160 A1 | 12/2016 | In et al. |
| 2019/0164498 A1* | 5/2019 | Jang .................. G09G 3/3266 |

FOREIGN PATENT DOCUMENTS

| | | |
|---|---|---|
| CN | 104900211 A | 9/2015 |
| CN | 105096865 A | 11/2015 |
| CN | 105679229 A | 6/2016 |
| CN | 105702225 A | 6/2016 |
| CN | 105825799 A | 8/2016 |
| CN | 106023943 A | 10/2016 |
| CN | 106486082 A | 3/2017 |
| CN | 106952624 A | 7/2017 |
| CN | 107039017 A | 8/2017 |
| CN | 108648716 A | 10/2018 |
| KR | 20170078978 A | 7/2017 |

OTHER PUBLICATIONS

Mar. 22, 2020—(IN) Office Action Appn 201947048691 with English Translation.

* cited by examiner

SHIFT REGISTER UNIT AND DRIVING METHOD THEREOF, GATE DRIVING CIRCUIT, AND DISPLAY DEVICE

CROSS-REFERENCE TO RELATED APPLICATION

The application is a U.S. National Phase Entry of International Application No. PCT/CN2019/085872 filed on May 7, 2019, designating the United States of America and claiming priority to Chinese Patent Application No. 201810828750.6 filed on Jul. 25, 2018. The present application claims priority to and the benefit of the above-identified applications and the above-identified applications are incorporated by reference herein in their entirety.

TECHNICAL FIELD

Embodiments of the present disclosure relate to a shift register unit and a driving method thereof, a gate driving circuit, and a display device.

BACKGROUND

In a field of display technology, a display panel, for example, a liquid crystal display (LCD) panel or an organic light emitting diode (OLED) display panel, includes a plurality of gate lines. The driving of the gate lines can be achieved by a gate driving circuit. The gate driving circuit is generally integrated into a gate driving chip (Gate IC). With rapid development of the display technology, display panels are developing increasingly towards high integration and low cost. Whereas in a design of the driving chip, an area of the chip is a major factor affecting the cost of the chip, how to effectively reduce the area of the chip is a problem that those technology developer need to consider emphatically.

SUMMARY

At least some embodiments of the present disclosure provide a shift register unit including: a blanking input circuit, a display input circuit, an output circuit, a control node, and a first node; the blanking input circuit is configured to input a blanking control signal to the first node during a blanking period in response to a blanking input signal, the blanking input circuit comprises a charging sub-circuit, the charging sub-circuit is configured to the input the blanking control signal to the control node in response to a first compensation control signal and a second compensation control signal, the display input circuit is configured to input a display control signal to the first node during a display period in response to a display input signal; and the output circuit is configured to output a composite output signal to an output end under control of a level of the first node.

For example, in the shift register unit provided by at least some embodiments of the present disclosure, one of the first compensation control signal and the second compensation control signal is a random signal.

For example, in the shift register unit provided by at least some embodiments of the present disclosure, the charging sub-circuit includes a first transistor and a second transistor, a gate electrode of the first transistor is configured to receive the first compensation control signal, a first electrode of the first transistor is configured to be connected with a blanking control signal end to receive the blanking control signal, a second electrode of the first transistor is configured to be connected with a first electrode of the second transistor, a second electrode of the second transistor is configured to be connected with the control node, a gate electrode of the second transistor is configured to receive the second compensation control signal.

For example, in the shift register unit provided by at least some embodiments of the present disclosure, the blanking input circuit further includes: a storage sub-circuit configured to store the blanking control signal that is input by the charging sub-circuit; an isolation sub-circuit configured to input the blanking control signal to the first node under control of the blanking input signal.

For example, in the shift register unit provided by at least some embodiments of the present disclosure, the storage sub-circuit includes a first capacitor, a first electrode of the first capacitor is configured to be connected with the control node, a second electrode of the first capacitor is configured to be connected with a first voltage end to receive a first voltage; the isolation sub-circuit includes a third transistor, a gate electrode of the third transistor is configured to be connected with a blanking input signal end to receive the blanking input signal, a first electrode of the third transistor is configured to be connected with the control node, a second electrode of the third transistor is configured to be connected with the first node.

For example, in the shift register unit provided by at least some embodiments of the present disclosure, the display input circuit includes a fourth transistor, a gate electrode of the fourth transistor is connected with a display input signal end to receive the display input signal, a first electrode of the fourth transistor is connected with a display control signal end to receive the display control signal, and a second electrode of the fourth transistor is connected with the first node.

For example, in the shift register unit provided by at least some embodiments of the present disclosure, the output end includes a shift signal output end and a first pixel signal output end, and the output circuit includes a first output transistor, a second output transistor, and a second capacitor; a gate electrode of the first output transistor is connected with the first node, a first electrode of the first output transistor is connected with a first output clock signal end to receive a first output clock signal, and a second electrode of the first output transistor is connected with the shift signal output end; a gate electrode of the second output transistor is connected with the first node, a first electrode of the second output transistor is connected with the first output clock signal end to receive the first output clock signal, and a second electrode of the second output transistor is connected with the first pixel signal output end; a first electrode of the second capacitor is connected with the first node, and a second electrode of the second capacitor is connected with the second electrode of the first output transistor; the first output clock signal is transmitted to the shift signal output end through the first output transistor to be as a first output signal, the first output clock signal is transmitted to the first pixel signal output end through the second output transistor to be as a second output signal, and the composite output signal includes the first output signal and the second output signal.

For example, in the shift register unit provided by at least some embodiments of the present disclosure, the output end further includes a second pixel signal output end, and the output circuit further includes a third output transistor, a gate electrode of the third output transistor is connected with the first node, a first electrode of the third output transistor is connected with a second output clock signal end to receive a second output clock signal, and a second electrode of the third output transistor is connected with the second pixel signal output end; the second output clock signal is transmitted to the second pixel signal output end through the third output transistor to be as a third output signal, and the composite output signal further includes the third output signal.

For example, in the shift register unit provided by at least some embodiments of the present disclosure, the blanking control signal is identical to the display control signal.

For example, the shift register unit provided by at least some embodiments of the present disclosure further includes a noise reduction circuit, a first control circuit, and a second node, the noise reduction circuit is configured to perform noise reduction on the first node and the output end under control of a level of the second node; the first control circuit is configured to control the level of the second node under control of the level of the first node.

For example, in the shift register unit provided by at least some embodiments of the present disclosure, the first control circuit includes a fifth transistor, a sixth transistor, and a seventh transistor; a gate electrode of the fifth transistor is connected with the first node, a first electrode of the fifth transistor is connected with the second node, and a second electrode of the fifth transistor is connected with a second voltage end to receive a second voltage; a gate electrode of the sixth transistor is connected with a first electrode of the sixth transistor and is configured to be connected with a third voltage end to receive a third voltage, and a second electrode of the sixth transistor is connected with the second node; a gate electrode of the seventh transistor is connected with a first electrode of the seventh transistor and is configured to be connected with a fourth voltage end to receive a fourth voltage, and a second electrode of the seventh transistor is connected with the second node.

For example, in the shift register unit provided by at least some embodiments of the present disclosure, the output end includes a shift signal output end and a first pixel signal output end, and the noise reduction circuit includes a first noise reduction transistor, a second noise reduction transistor, and a third noise reduction transistor; a gate electrode of the first noise reduction transistor is connected with the second node, a first electrode of the first noise reduction transistor is connected with the first node, and a second electrode of the first noise reduction transistor is connected with a second voltage end to receive a second voltage; a gate electrode of the second noise reduction transistor is connected with the second node, a first electrode of the second noise reduction transistor is connected with the shift signal output end, and a second electrode of the second noise reduction transistor is connected with the second voltage end to receive the second voltage; a gate electrode of the third noise reduction transistor is connected with the second node, a first electrode of the third noise reduction transistor is connected with the first pixel signal output end, and a second electrode of the third noise reduction transistor is connected with a fifth voltage end to receive a fifth voltage.

For example, in the shift register unit provided by at least some embodiments of the present disclosure, the output end further includes a second pixel signal output end, and the noise reduction circuit further includes a fourth noise reduction transistor; a gate electrode of the fourth noise reduction transistor is connected with the second node, a first electrode of the fourth noise reduction transistor is connected with the second pixel signal output end, and a second electrode of the fourth noise reduction transistor is connected with the fifth voltage end to receive the fifth voltage.

For example, the shift register unit provided by at least some embodiments of the present disclosure further includes a second control circuit; the second control circuit is configured to control the level of the second node in response to a first control signal.

For example, the shift register unit provided by at least some embodiments of the present disclosure further includes a blanking reset circuit and a display reset circuit; the blanking reset circuit is configured to reset the first node in response to a blanking reset signal; and the display reset circuit is configured to reset the first node in response to a display reset signal.

At least some embodiments of the present disclosure also provide a gate driving circuit including a plurality of cascaded shift register unit according to any one of the above described embodiments.

For example, the gate driving circuit provided by at least some embodiments of the present disclosure further includes a first sub-clock signal line, a second sub-clock signal line, a third sub-clock signal line, and a fourth sub-clock signal line; in a case where each of the shift register units includes a first output clock signal end, a first output clock signal end of a $(4n_1-3)$-th stage shift register unit is connected with the first sub-clock signal line; a first output clock signal end of a $(4n_1-2)$-th stage shift register unit is connected with the second sub-clock signal line; a first output clock signal end of a $(4n_1-1)$-th stage shift register unit is connected with the third sub-clock signal line; a first output clock signal end of a $(4n_1)$-th stage shift register unit is connected with the fourth sub-clock signal line; and $n_1$ is an integer larger than zero.

For example, in the gate driving circuit provided by at least some embodiments of the present disclosure, in a case where each of the shift register units includes a display input signal end and a shift signal output end, a display input signal end of a $(n_2+2)$-th stage shift register unit is connected with a shift signal output end of a $n_2$-th stage shift register unit, and $n_2$ is an integer larger than zero.

For example, in the gate driving circuit provided by at least some embodiments of the present disclosure, a signal that is output by the shift signal output end of the $n_2$-th stage shift register unit serves as a second compensation control signal of the $(n_2+2)$-th stage shift register unit; or a signal that is output by a shift signal output end of a $(n_2+3)$-th stage shift register unit serves as a second compensation control signal of the $n_2$-th stage shift register unit; or a signal that is output by the shift signal output end of the $n_2$-th stage shift register unit serves as a second compensation control signal of the $n_2$-th stage shift register unit; or a signal that is output by the shift signal output end of the $n_2$-th stage shift register unit serves as a second compensation control signal of the $(n_2+2)$-th stage shift register unit, and a signal that is output by the shift signal output end of the $n_2$-th stage shift register unit also serves as a blanking control signal of the $(n_2+2)$-th stage shift register unit.

For example, the gate driving circuit provided by at least some embodiments of the present disclosure further includes a fifth sub-clock signal line; in a case where each of the shift register units includes a blanking input signal end, a blanking input signal end of each stage shift register unit is connected with the fifth sub-clock signal line.

At least some embodiments of the present disclosure further provide a display device including the gate driving circuit according to any one of the above described embodiments.

At least some embodiments of the present disclosure further provide a driving method for the shift register unit according to any one of the above described embodiments, the driving method includes a display period and a blanking period for one frame: the display period including: a first input phase, in response to the display input signal, inputting the display control signal to the first node by the display input circuit; a first output phase, under control of the level of the first node, outputting the composite output signal to the output end by the output circuit; a charging phase, in response to the first compensation control signal and the second compensation control signal, inputting the blanking control signal to the control node by the charging sub-circuit; the blanking period including: a second input phase, in response to the blanking input signal, inputting the blanking control signal to the first node by the blanking input circuit; a second output phase, under control of the level of the first node, outputting the composite output signal to the output end by the output circuit.

BRIEF DESCRIPTION OF THE DRAWINGS

In order to more clearly illustrate technical solutions of embodiments of the present disclosure, drawings of the embodiments will be briefly introduced below, and obviously drawings described below involve only some embodiments of the present disclosure, but are not to limit the present disclosure.

DESCRIPTION OF THE EMBODIMENTS

Figure 1:
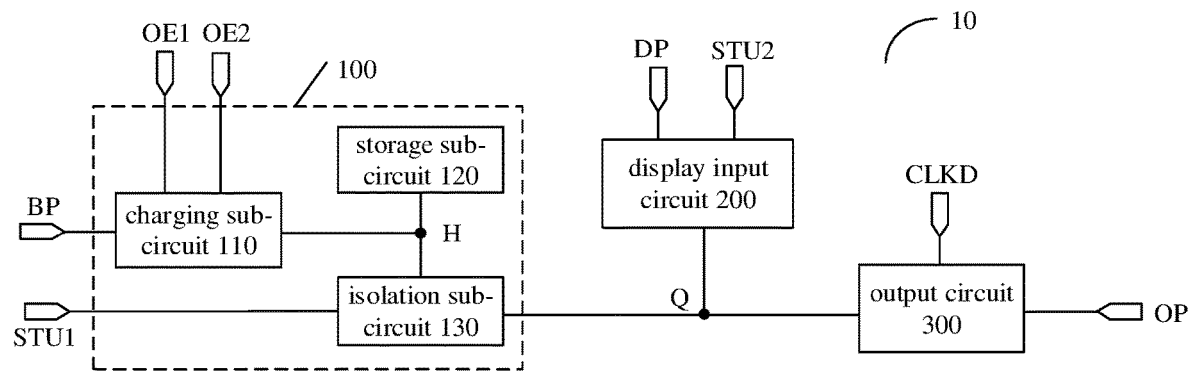
FIG. 1 is a schematic block diagram of a shift register unit provided by some embodiments of the present disclosure.

In order to make the object, technical solutions and advantages clearer, the technical solutions of the embodiments of the present disclosure will be clearly and completely described below in combination with the accompanying drawings of the embodiments of the present disclosure. Obviously, the described embodiments are a portion of the embodiments of the present disclosure, rather than all the embodiments. Based on the described embodiments of the present disclosure, further embodiments, which are obtained by one of ordinary skill in the art without premise of creative labors, all belong to the protection scope of the present disclosure.

Unless otherwise defined, technical or scientific terms used herein shall have ordinary meaning understood by one of ordinary skill in the art to which the invention belongs. The words "first", "second," and the like used in the present disclosure do not denote any order, quantity, or importance, but are used to distinguish different constituent parts. The word "comprising" or "including" or the like means that an element or object preceding the word encompasses element(s) or object(s) listed after this word and equivalents thereof, without excluding other elements or objects. The terms "connected" or "connecting" and the like are not limited to physical or mechanical connections, but may include electrical connections, whether direct or indirect. "On", "under", "left", "right", and the like are only used to indicate relative positional relationships, and when an absolute position of an object described is changed, the relative positional relationship may also be changed accordingly.

In order to make the following description of the embodiments of the present disclosure clear and concise, the present disclosure omits detailed description of known functions and known components.

In a generally OLED display panel, in addition to disposing a pixel compensation circuit in a sub-pixel unit to perform internal compensation, it is also possible to perform external compensation by providing a sensing transistor. When performing external compensation, a gate driving circuit composed of shift register units needs to provide drive signals used for a scan transistor and a sensing transistor, respectively, to the sub-pixel unit in the display panel, for example, a scan drive signal used for the scan transistor is provided in a display period (DS) of one frame, and providing a sensing drive signal used for the sensing transistor is provided in a blanking period (BL) of one frame.

Currently, in a GOA (Gate-driver on Array) circuit, sensing drive signals output by the gate driving circuit are scanned sequentially line by line. For example, a sensing drive signal used for a first row of sub-pixel units in the display panel is output during a blanking period of a first frame, and a sensing drive signal used for a second row of sub-pixel units in the display panel is output during a blanking period of a second frame, and so on, thereby completing to perform progressive (line-by-line) sequential compensation on the display panel. Progressive sequential compensation over a lone period of time would bring two severe problems: one problem is that there is a scan line moving line-by-line in a scan display process of a plurality of frames, the other problem is that difference in brightness between difference regions on the display panel due to the difference in compensation time is large. For example, when performing external compensation on a 100-th row of sub-pixel units of the display panel, although external compensation has already been performed on a 10-th row of sub-pixel units of the display panel, at the same time, light-emitting brightness of the 10-th row of sub-pixel units may have changed, for example, the light-emitting brightness has decreased, thereby causing uneven brightness of different regions of the display panel, which is even more obvious in a large-sized display panel. Furthermore, because in display of high frequency and high resolution, waveforms of the scan drive signals need to have a certain overlap, the overlapped waveforms have a great influence on a compensation detection process, which easily cause compensation signals to be erroneously output.

At least some embodiments of the present disclosure provide a shift register unit and a driving method thereof, a gate driving circuit, and a display device, the shift register unit comprises a blanking input circuit, a display input circuit, an output circuit, a control node, and a first node; the blanking input circuit is configured to input a blanking control signal to the first node during a blanking period in response to a blanking input signal, and, the blanking input circuit comprises a charging sub-circuit, the charging sub-circuit is configured to the input the blanking control signal to the control node in response to a first compensation control signal and a second compensation control signal, the display input circuit is configured to input a display control signal to the first node during a display period in response to a display input signal; the output circuit is configured to output a composite output signal to an output end under control of a level of the first node.

A circuit structure of the shift register unit in the embodiments of the present disclosure is simple, which can achieve random compensation, thereby avoiding a scan line and brightness deviation of a panel caused by progressive sequential compensation, improving display uniformity, and improving a display effect.

It should be noted that, in the embodiments of the present disclosure, random compensation refers to an external compensation method that is different from the progressive sequential compensation, a sensing drive signal corresponding to arbitrary row of sub-pixel units of the display panel may be randomly outputted during a blanking period of a certain frame, to achieve performing operation of compensation for this row of sub-pixel units, the following embodiments are the same as those described herein, and the repeated descriptions will not be repeated again.

Furthermore, in the embodiments of the present disclosure, "one frame", "each frame", or "certain frame" includes a display period and a blanking period that are successively performed. For example, during the display period, the gate driving circuit outputs display output signals, the display output signals can drive the display panel from a first row to a last row to complete a scan display of an entire image; during the blanking period, the gate driving circuit outputs a blanking output signal, the blanking output signal can be used for driving sensing transistors in a certain row of sub-pixel units in the display panel, to complete external compensation for this row of sub-pixel units.

Several embodiments of the present disclosure are illustrated in details below in conjunction with the drawings, but the present disclosure is not limited to those specific embodiments.

FIG. 1 is a schematic block diagram of a shift register unit provided by some embodiments of the present disclosure. For example, as shown in FIG. 1, a shift register unit 10 can include a blanking input circuit 100, a display input circuit 200, an output circuit 300, a control node H, and a first node Q. A gate driving circuit can be obtained by means of cascading a plurality of shift register units 10, the gate driving circuit is configured to drive a display panel, provide sequentially scan signals for a plurality of gate lines of the display panel, thereby performing progressive or interlaced scanning and the like during a period when the display panel displays one frame of picture.

For example, the blanking input circuit 100 is configured to input a blanking control signal (i.e., a blanking pull-up signal) to the first node Q (herein as a pull-up node) during a blanking period in response to a blanking input signal. For example, as shown in FIG. 1, the blanking input circuit 100 is connected to a blanking input signal end STU1, a blanking control signal end BP (i.e., a blanking pull-up signal end), and the first node Q. The blanking input circuit 100 can receive and store the blanking control signal provided by the blanking control signal end BP during a display period of a N-th frame, and output the blanking control signal to the first node Q according to the blanking input signal during a blanking period of the N-th frame, thereby pulling a potential of the first node Q up to a working potential. For another example, the blanking input circuit 100 can also receive and store the blanking control signal during the blanking period of the N-th frame, and output the blanking control signal to the first node Q according to the blanking input signal during a blanking period of a (N+1)-th frame, thereby pulling a potential of the first node Q up to a working potential. Embodiments of the present disclosure are not limited thereto.

For example, the blanking input circuit 100 includes a charging sub-circuit 110, the charging sub-circuit 110 is configured to input the blanking control signal to the control node H (herein as a pull-up control node) in response to a first compensation control signal and a second compensation control signal. For example, as shown in FIG. 1, the charging sub-circuit 110 is connected to a first compensation control signal end OE1, a second compensation control signal end OE2, the blanking control signal end BP, and the control node H, during a display period of one frame, in a case where the charging sub-circuit 110 is turned on under control of the first compensation control signal and the second compensation control signal, the charging sub-circuit 110 inputs the blanking control signal outputted by the blanking control signal end BP to the control node H.

For example, the display input circuit 200 is configured to input a display control signal (i.e., a display pull-up signal) to the first node Q during a display period in response to a display input signal. For example, as shown in FIG. 1, the display input circuit 200 is connected a display input signal end STU2, a display control signal end DP (i.e., a display pull-up signal end), and the first node Q, in a case where the display input circuit 200 is turned on under control of the display input signal provided by the display input signal end STU2, the display control signal end DP is connected with the first node Q, thereby writing the display control signal supplied from the display control signal end DP to the first node Q, to pull the potential of the first node Q up to the working potential.

For example, the blanking control signal may be identical to the display control signal. In other words, the blanking control signal end BP and the display control signal end DP may be the same signal end, thus reducing the amount of the signal ends and saving cost; or, the blanking control signal end BP and the display control signal end DP may also be different signal ends, but output the same signal. The present disclosure is not limited thereto, for example, the blanking control signal and the display control signal may also be different.

For example, the output circuit 300 is configured to output a composite output signal to an output end OP under control of a level of the first node Q. For example, as shown in FIG. 1, the output circuit 300 is connected to the first node Q, a first output clock signal end CLKD, and the output end OP. In a case where the output circuit 300 is turned on under control of the level of the first node Q, the composite output signal provided by the first output clock signal end CLKD is output to the output end OP. For example, an output signal of the output end OP can include a display output signal and a blanking output signal, the display output signal and the blanking output signal can be signals of two waveforms, which are independent of each other, having different widths and timing sequences. For example, during the display period of one frame, the output circuit 300 outputs the display output signal via the output end OP under control of the level of the first node Q, to drive a scan transistor in a pixel unit, thereby performing display; during the blanking period of one frame, the output circuit 300 outputs the blanking output signal via the output end OP under control of the level of the first node Q, to drive a sensing transistor in the pixel unit, thereby performing compensation detection.

In the embodiments of the present disclosure, the blanking input circuit 100, the display input circuit 200, and the output circuit 300 can be integrated, so that both the blanking output signal in the blanking period of one frame of the picture and the display output signal in the display period of one frame of the picture are output through the same output circuit 300, thereby simplifying the circuit structure, and reducing a size of the shift register unit and a size of the gate driving circuit including the shift register unit.

For example, one of the first compensation control signal and the second compensation control signal is a random signal. In some examples, the first compensation control signal is the random signal, the first compensation control signal end OE1 is connected with an external control circuit, the external control circuit can provide the first compensation control signal to the first compensation control signal end OE1, and the first compensation control signal may be the random signal. The external control circuit, for example, can be implemented by employing a Field Programmable Gate Array (FPGA) or other signal generation circuits, thus outputting the random signal of a suitable type as the first compensation control signal. For example, the external control circuit can be configured to output the random signal to the first compensation control signal end OE1 during the display period of one frame. Hereinafter, the shift register unit provided by the present disclosure is described in detail by taking the first compensation control signal as the random signal as an example. However, the present disclosure is not limited thereto, in some other embodiments, the second compensation control signal may be the random signal, or both the first compensation control signal and the second compensation control signal are random signals.

For example, the output end OP can include a shift signal output end and a first pixel signal output end. In some examples, a second compensation control signal end OE2 in a current stage shift register unit can be connected with a shift signal output end in the current stage shift register unit, so that a signal that is output by the shift signal output end can be used as the second compensation control signal.

For example, in some examples, the external control circuit can be connected with shift signal output ends in all stages of shift register units, according to practical requirements, the external control circuit can select randomly a signal of a shift signal output end of one shift register unit during the display period of one frame, and output the signal to the first compensation control signal end OE1.

For example, in some embodiments, when random detection is performed, in a N-th frame, an i-th row of sub-pixel units in the display panel needs to be detected. The i-th row of sub-pixel units corresponds to a i-th stage shift register unit, in the i-th stage shift register unit, during a display period of the N-th frame, the external control circuit is used to transmit a signal that is output by the shift signal output end of the i-th stage shift register unit to first compensation control signal ends OE1 of all stage of shift register units, i.e., waveform pulse widths and timing sequences of the first compensation control signals of all stages of the shift register units can be the same as a waveform pulse width and timing sequence of the signal that is output by the shift signal output end of the i-th stage shift register unit. Because the second compensation control signal of the i-th stage shift register unit is also the signal that is output by the shift signal output end of the i-th stage shift register unit, and the charging sub-circuit 110 is commonly controlled by the first compensation control signal and the second compensation control signal, in a case where waveforms of the output signals do not overlap, only the charging sub-circuit 110 in the i-th stage shift register unit can be turned on under control of the first compensation control signal and the second compensation control signal. Because the charging sub-circuit 110 is connected to the blanking control signal end BP and the control node H, in the i-th stage shift register unit, in a case where the charging sub-circuit 110 is turned on, the blanking control signal outputted by the blanking control signal end BP is a high-level signal, and thus the control node H can be charged using the blanking control signal, so that the control node H is charged to a high level. Thus, in the blanking period of the N-th frame, the high-level signal of the control node H of the i-th stage shift register unit can be transmitted to the first node Q, so that the output circuit 300 of the i-th stage shift register unit can output the blanking output signal used to drive sensing transistors in the i-th row of sub-pixel units.

For example, the shift register unit provided by the embodiments of the present disclosure can also achieve the progressive sequential compensation. When the progressive sequential compensation is performed, in some examples, the second compensation control signal end OE2 of the current stage shift register unit can be connected with the shift signal output end of the current stage shift register unit, the first compensation control signal ends OE1 of all stage of shift register units receive a signal of a shift signal output end of a first stage shift register unit during a display period of a first frame, the first compensation control signal ends OE1 of all stage of shift register units receive a signal of a shift signal output end of a second stage shift register unit during a display period of a second frame, and so on, and thus, during the display period of the first frame, only the control node H of the first stage shift register unit can be charged to be at a high level, during the display period of the second frame, only the control node H of the second stage shift register unit can be charged to be at a high level, and so on, so that the display panel can achieve the progressive sequential compensation.

The shift register unit 10 provided by the embodiments of the present disclosure, by setting the charging sub-circuit 110, can also achieve the random compensation under premise of taking into account the progressive sequential compensation, thereby avoiding poor display problems such as scan lines and display brightness unevenness caused by the progressive sequential compensation, and other problems.

For example, as shown in FIG. 1, the blanking input circuit 100 further comprises a storage sub-circuit 120 and an isolation sub-circuit 130. The storage sub-circuit 120 is connected with the control node H, and is configured to store the blanking control signal that is input by the charging sub-circuit 110. For example, in some examples, in the display period of one frame, the control node H is charged to be at the high level by using the blanking control signal, the storage sub-circuit 120 can store the blanking control signal, so that the high level of the control node H is maintained until the blanking period of the frame.

For example, the isolation sub-circuit 130 is configured to input, under control of the blanking input signal, the blanking control signal to the first node Q during the blanking period. As shown in FIG. 1, the isolation sub-circuit 130 is connected to the blanking input signal end STU1, the control node H, and the first node Q. In a case where the isolation sub-circuit 130 is turned on under control of the blanking input signal provided by the blanking input signal end STU1, the control node H is connected with the first node Q, thereby inputting the blanking control signal stored in the storage sub-circuit 120 to the first node Q to charge the first node Q, and thus pulling the potential of the first node Q up to the working potential.

It should be noted that, in various embodiments of the present disclosure, the blanking input circuit 100 can include arbitrary suitable sub-circuit, but is not restricted to the charging sub-circuit 110, the storage sub-circuit 120, and the isolation sub-circuit 130 described above, so long as the corresponding functions can be achieved.

Figure 2:
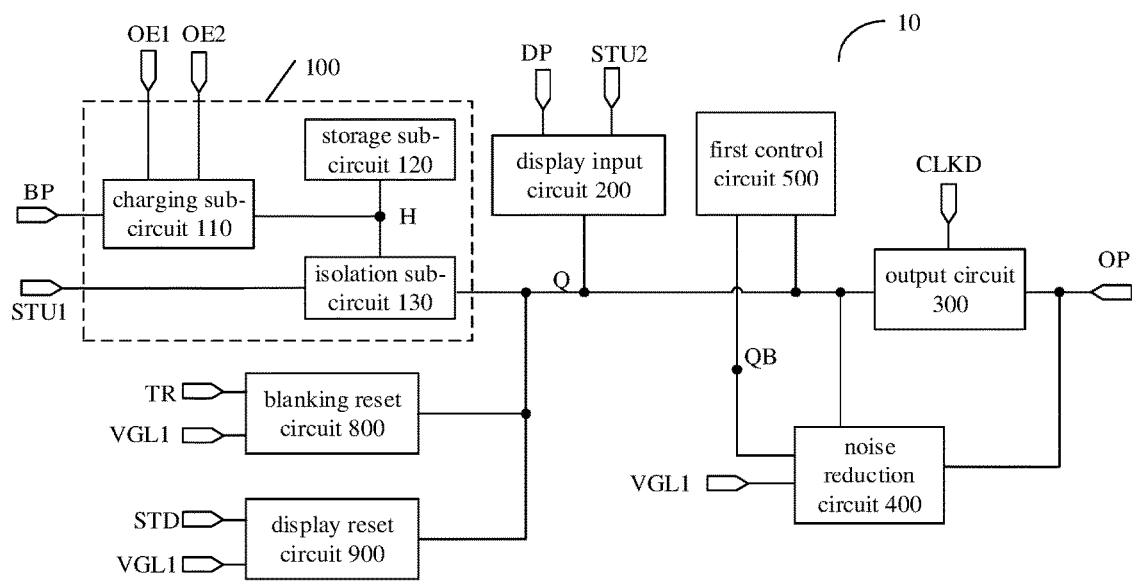
FIG. 2 is a schematic block diagram of another shift register unit provided by some embodiments of the present disclosure.

FIG. 2 is a schematic block diagram of another shift register unit provided by some embodiments of the present disclosure.

For example, as shown in FIG. 2, the shift register unit 10 can also include a noise reduction circuit 400 (herein as a pull-down circuit), a first control circuit 500 (herein as a first pull-down control circuit), and a second node QB (herein as a pull-down node).

For example, the noise reduction circuit 400 is configured to perform noise reduction on the first node Q and the output end OP under control of a level of the second node QB; in other words, the noise reduction circuit 400 is configured to pull both a level of the first node Q and a level of the output end OP down to a low level, under control of the level of the second node QB. For example, as shown in FIG. 2, the noise reduction circuit 400 is connected with the second node QB, the first node Q, a second voltage end VGL1, and output end OP, and in a case where the noise reduction circuit 400 is turned on under control of the level of the second node QB, the first node Q and the output end OP can be connected to the second voltage end VGL1 (for example, a low voltage end), thereby pulling the first node Q down to a non-working potential and pulling the level of the output end OP down to a low level through a second voltage of the second voltage end VGL1, so as to achieve noise reduction of the first node Q and output end OP.

It should be noted that, in the embodiments of the present disclosure, the second voltage end VGL1, for example, can be configured to provide the second voltage, and the second voltage is a DC (direct current) low-level signal, and the following embodiments are the same as those described herein, and the repeated descriptions will not be described again.

For example, the first control circuit 500 is configured to control the level of the second node QB under control of the level of the first node Q. For example, as shown in FIG. 2, the first control circuit 500 is connected to the first node Q and the second node QB. The first control circuit 500 can be configured to pull the second node QB down to the low level in a case where the first node Q is at a high level, and to pull the second node QB up to the high level in a case where the first node Q is at a low level. For example, the first control circuit 500 can be an inverter circuit, an input end of the inverter circuit is connected to the first node Q, an output end of the inverter circuit is connected to the second node QB.

It should be noted that, other circuit structures of the shift register unit 10 as shown in FIG. 2 are substantially the same as those of the shift register unit 10 as shown in FIG. 1, and the repeated descriptions will not be described herein again.

Figure 3:
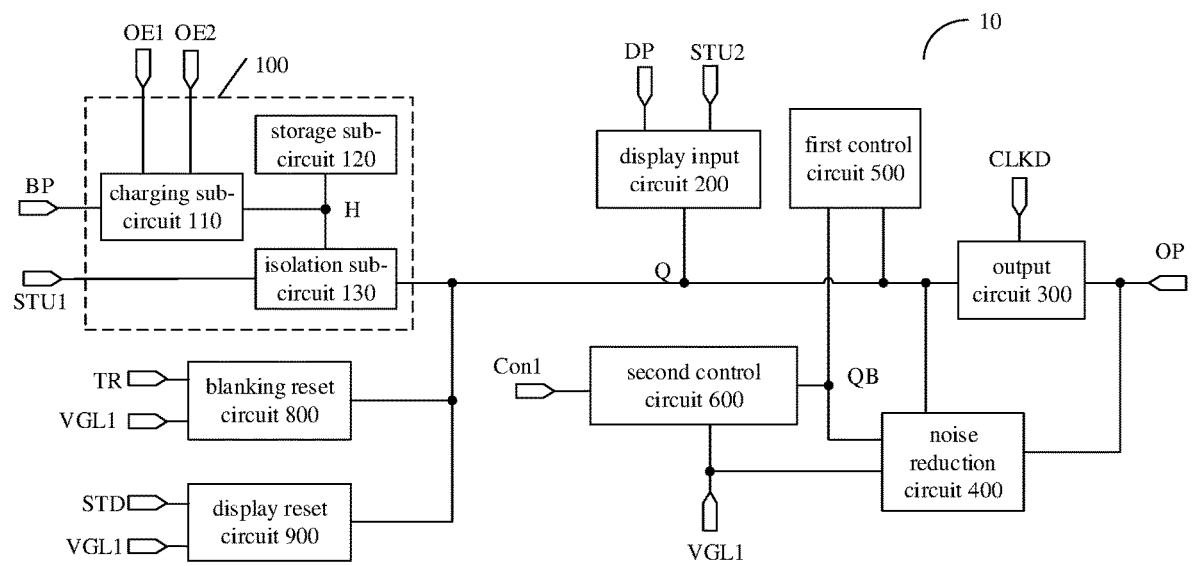
FIG. 3 is a schematic block diagram of yet another shift register unit provided by some embodiments of the present disclosure.
Figure 4:
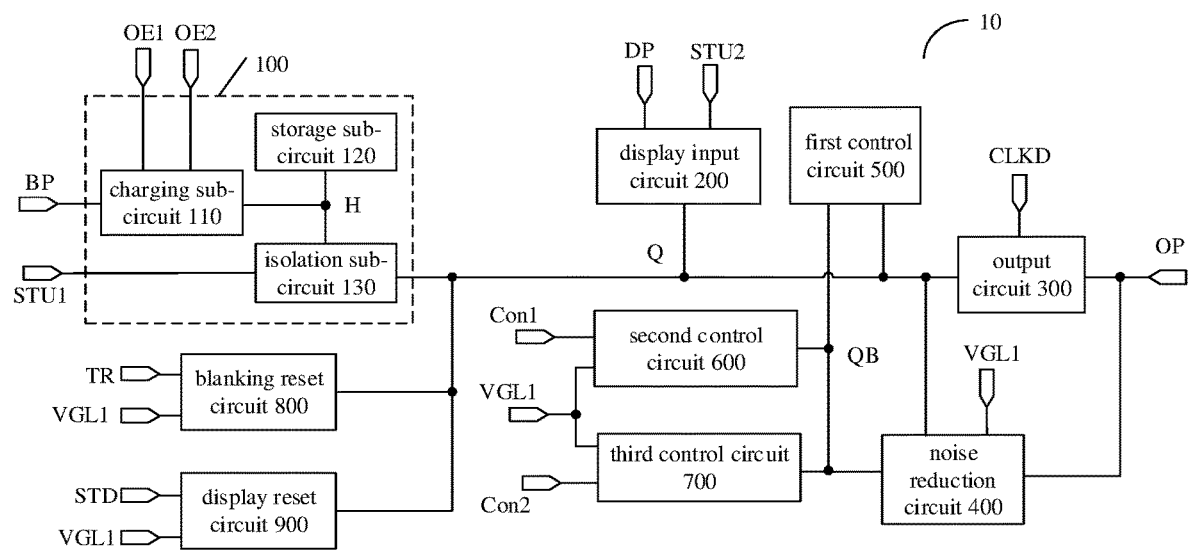
FIG. 4 is a schematic block diagram of still yet another shift register unit provided by some embodiments of the present disclosure.

FIG. 3 is a schematic block diagram of yet another shift register unit provided by some embodiments of the present disclosure, FIG. 4 is a schematic block diagram of still yet another shift register unit provided by some embodiments of the present disclosure.

For example, as shown in FIG. 3, the shift register unit 10 can also include a second control circuit 600 (herein as a second pull-down control circuit). The second control circuit 600 is configured to control the level of the second node QB in response to a first control signal (herein as a blanking pull-down control signal). For example, as shown in FIG. 3, the second control circuit 600 is connected to the second voltage end VGL1, the second node QB, and a blanking pull-down control end Con1, and the second control circuit 600 is configured to, during the blanking period of one frame, be turned on under control of the first control signal provided by the blanking pull-down control end Con1, and to connect the second node QB with the second voltage end VGL1, thereby pulling the second node QB down to a non-working potential by the second voltage of the second voltage end VGL1.

Because after the shift register unit is operated for a long period of time, threshold voltages of transistors in the circuit easily have a drift, for example, a positive drift, therefore, a high level written to the first node by the blanking input circuit 100 may be lower than a predetermined value, so that it is difficult to pull down the second node QB by the first control circuit 500, which also further affects the output signal of the output end OP. The shift register unit 10 provided by the embodiments of the present disclosure includes the second control circuit 600, the second control circuit 600 can perform a pull-down operation on the second node QB in the blanking period of one frame, to ensure that the second node QB is at a low level, so that the blanking input circuit 100 more sufficiently charges the first node Q, and thus the high level of the first node Q reaches the predetermined value, thereby preventing the threshold voltage drift of transistors from affecting the output signal, and enhancing the reliability of the circuit.

For example, as shown in FIG. 4, the shift register unit 10 can also include a third control circuit 700 (herein as a third pull-down control circuit). The third control circuit 700 is configured to control the level of the second node QB in response to a second control signal (herein as a display pull-down control signal). For example, the third control circuit 700 is connected to the second node QB, a display pull-down control end Con2, and the second voltage end VGL1. During the display period of one frame, under control of the second control signal provided by the display pull-down control end Con2, in a case where the third control circuit 700 is turned on, the second node QB is connected with the second voltage end VGL1, thereby pulling the second node QB down to a non-working potential by the second voltage of the second voltage end VGL1.

In the shift register unit 10 provided by the embodiments of the present disclosure, the third control circuit 700 can perform a pull-down operation on the second node QB in the display period of one frame, to ensure that the second node QB is at a low level, so that the display input circuit 200 more sufficiently charges the first node Q, and thus the high level of the first node Q reaches the predetermined value, thereby preventing the threshold voltage drift of transistors from affecting the output signal, and enhancing the reliability of the circuit.

It should be noted that, in the shift register unit provided by the embodiments of the present disclosure, unlike the examples shown in FIG. 3 and FIG. 4, in some examples, the shift register unit may also only include a third control circuit 700, rather than include the second control circuit 600.

For example, as shown in FIG. 2, FIG. 3, and FIG. 4, the shift register unit 10 further includes a blanking reset circuit 800 and a display reset circuit 900. The blanking reset circuit 800 is configured to reset the first node Q in response to a blanking reset signal. The display reset circuit 900 is configured to reset the first node Q in response to a display reset signal.

For example, as shown in FIG. 2, FIG. 3, and FIG. 4, the blanking reset circuit 800 is connected to a blanking reset signal end TR, the second voltage end VGL1, and the first node Q. Under control of the blanking reset signal provided by the blanking reset signal end TR, in a case where the blanking reset circuit 800 is turned on, the first node Q is connected with the second voltage end VGL1, so that the first node Q is pulled down to a non-working potential by the second voltage of the second voltage end VGL1 to reset the first node Q, i.e., the second voltage having a low level is written into the first node Q. For example, during the blanking period of one frame, after the output circuit 300 completes output of the signals, the blanking reset circuit 800 is turned on under control of the blanking reset signal, thereby writing the second voltage outputted by the second voltage end VGL1 into the first node Q to reset the first node Q; for another example, before the display period of one frame, the blanking reset circuit 800 is turned on under control of the blanking reset signal, thereby writing the second voltage outputted by the second voltage end VGL1 into the first node Q to reset the first node Q.

For example, as shown in FIG. 2, FIG. 3, and FIG. 4, the display reset circuit 900 is connected to a display reset signal end STD, the second voltage end VGL1, and the first node Q. Under control of the display reset signal provided by the display reset signal end STD, in a case where the display reset circuit 900 is turned on, the first node Q is connected with the second voltage end VGL1, so that the first node Q is pulled down to a non-working potential by the second voltage of the second voltage end VGL1, so as to reset the first node Q. For example, during the display period of one frame, after the output circuit 300 completes output of the signals, the display reset circuit 900 is turned on under control of the display reset signal, thereby writing the second voltage outputted by the second voltage end VGL1 into the first node Q to reset the first node Q.

It is worth noting that, other circuit structures of the shift register units 10 as shown in FIG. 3 and FIG. 4 can be substantially the same as those of the shift register unit 10 as shown in FIG. 2, and the repeated descriptions will not be described again. In addition, in the examples shown in FIG. 3 and FIG. 4, the first control circuit 500, the second control circuit 600, the third control circuit 700, the blanking reset circuit 800, and the display reset circuit 900 are all connected to the second voltage VGL1 to receive a DC low-level signal, but the present disclosure is not limited thereto, the first control circuit 500, the second control circuit 600, the third control circuit 700, the blanking reset circuit 800, and the display reset circuit 900 can also be respectively connected to different power supply voltage ends to receive different low-level signals, as long as the corresponding functions can be achieved, the present disclosure is not specifically limited thereto.

Figure 5A:
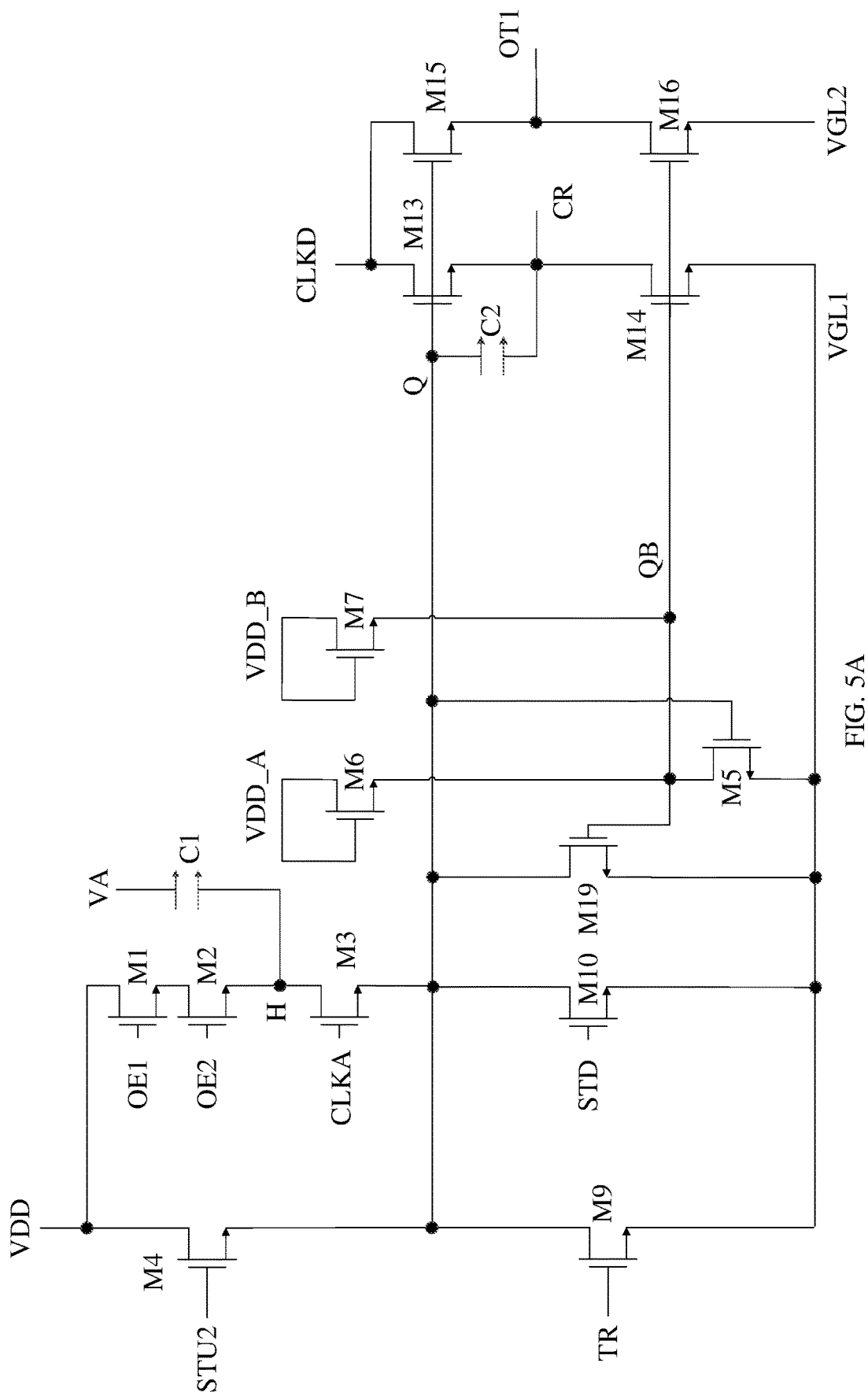
FIG. 5A is a circuit structure diagram of the shift register unit shown in FIG. 2.
Figure 5B:
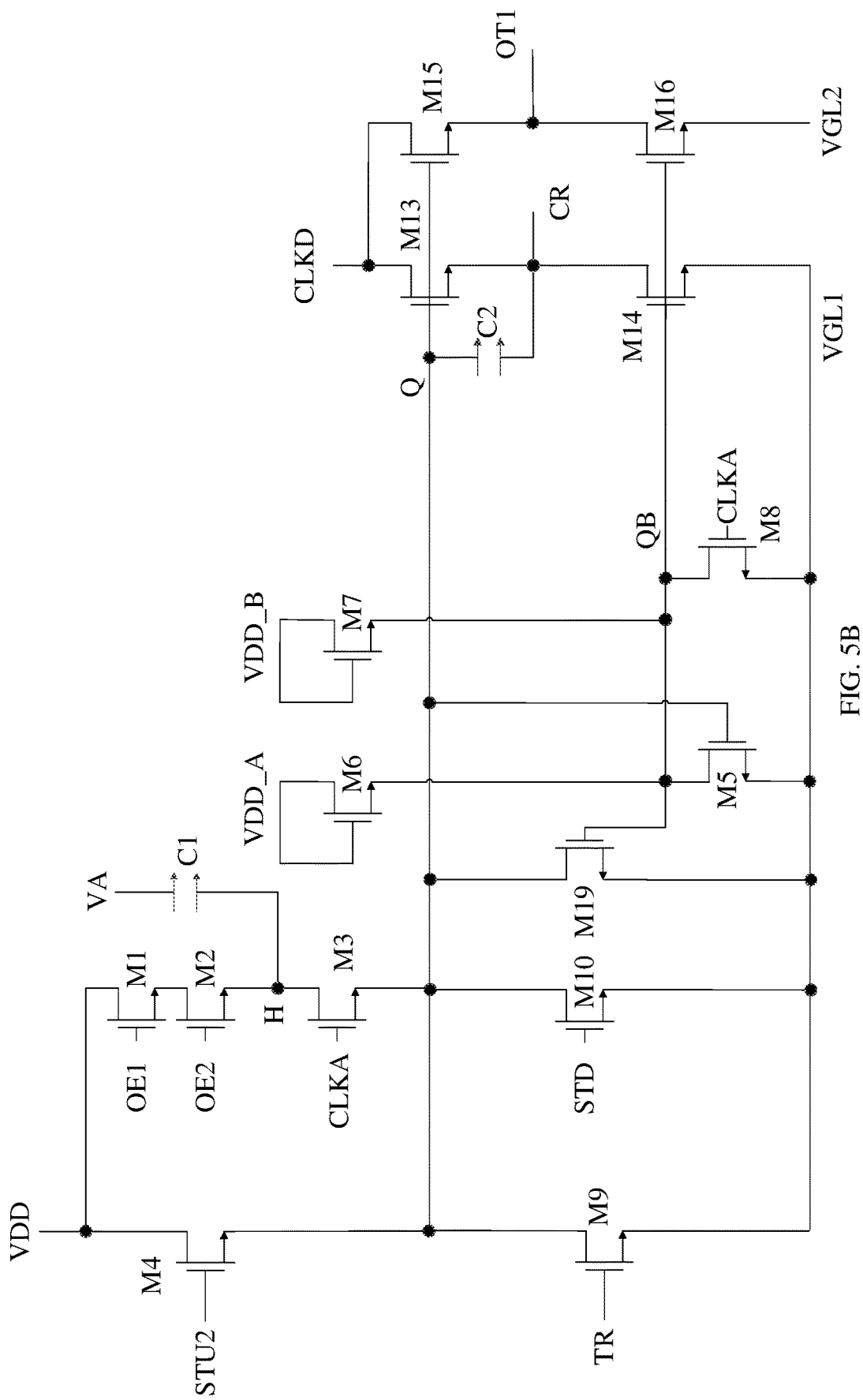
FIG. 5B is a circuit structure diagram of the shift register unit shown in FIG. 3.
Figure 5C:
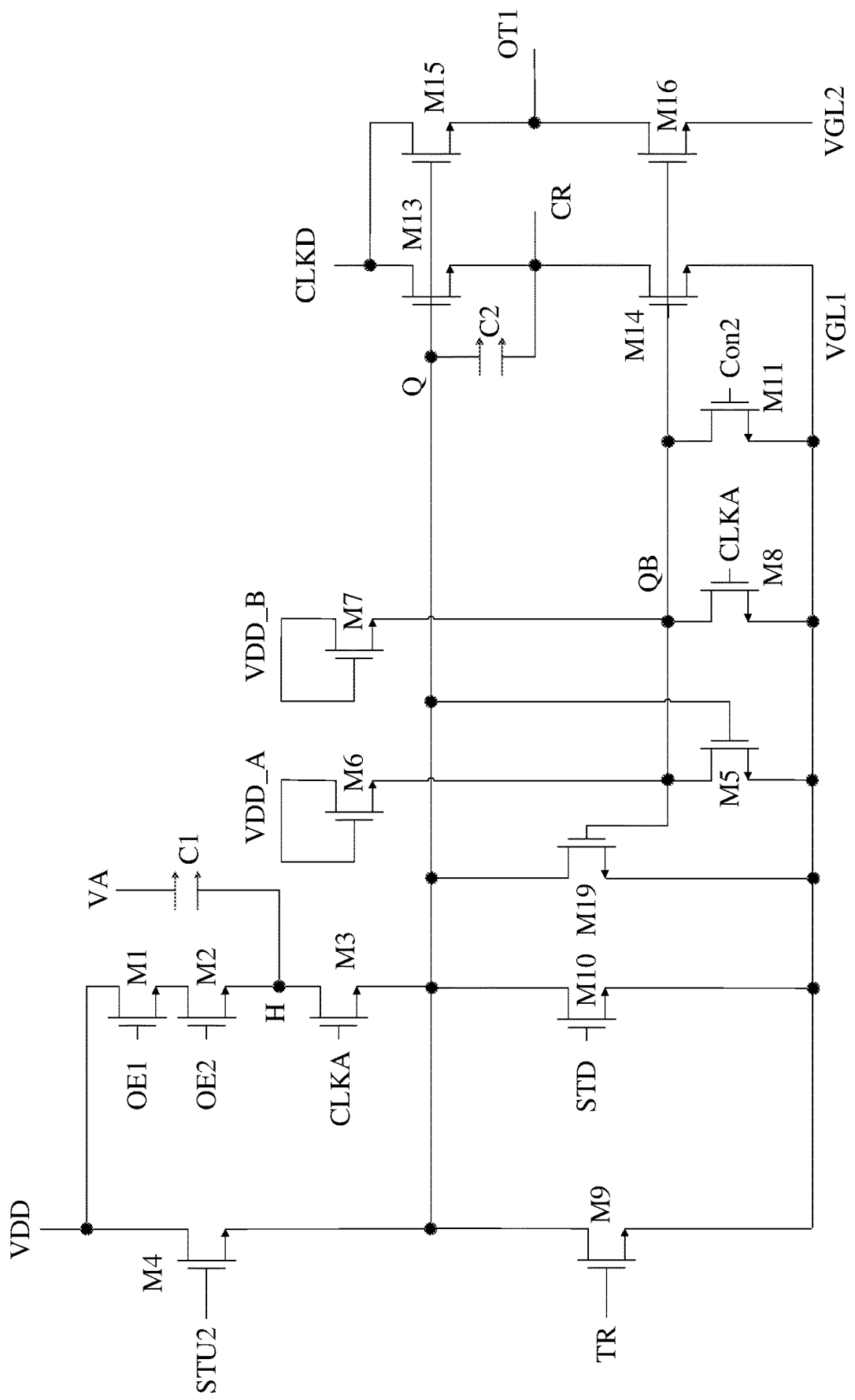
FIG. 5C is a circuit structure diagram of the shift register unit shown in FIG. 4.
Figure 6A:
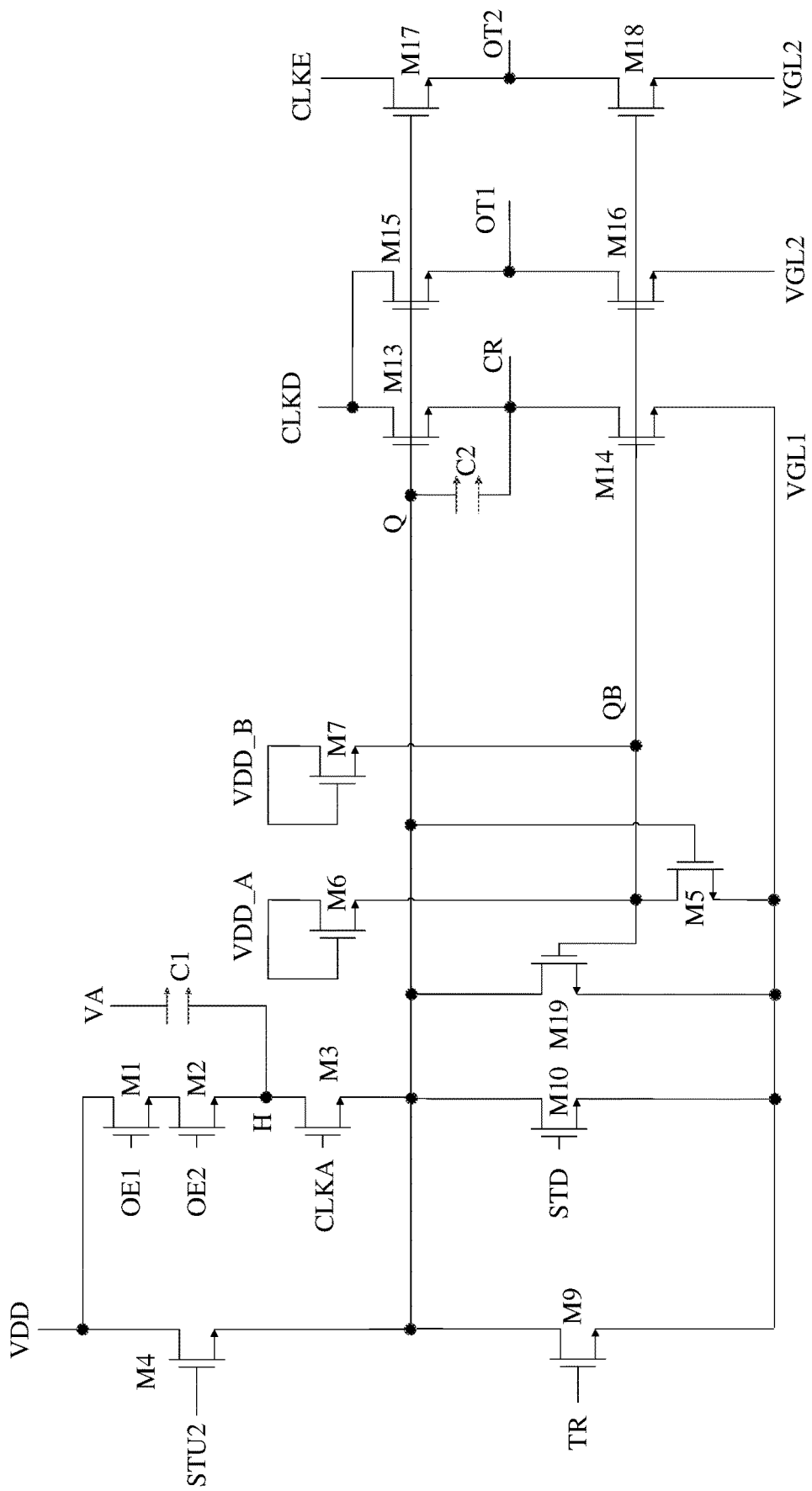
FIG. 6A is another circuit structure diagram of the shift register unit shown in FIG. 2.
Figure 6B:
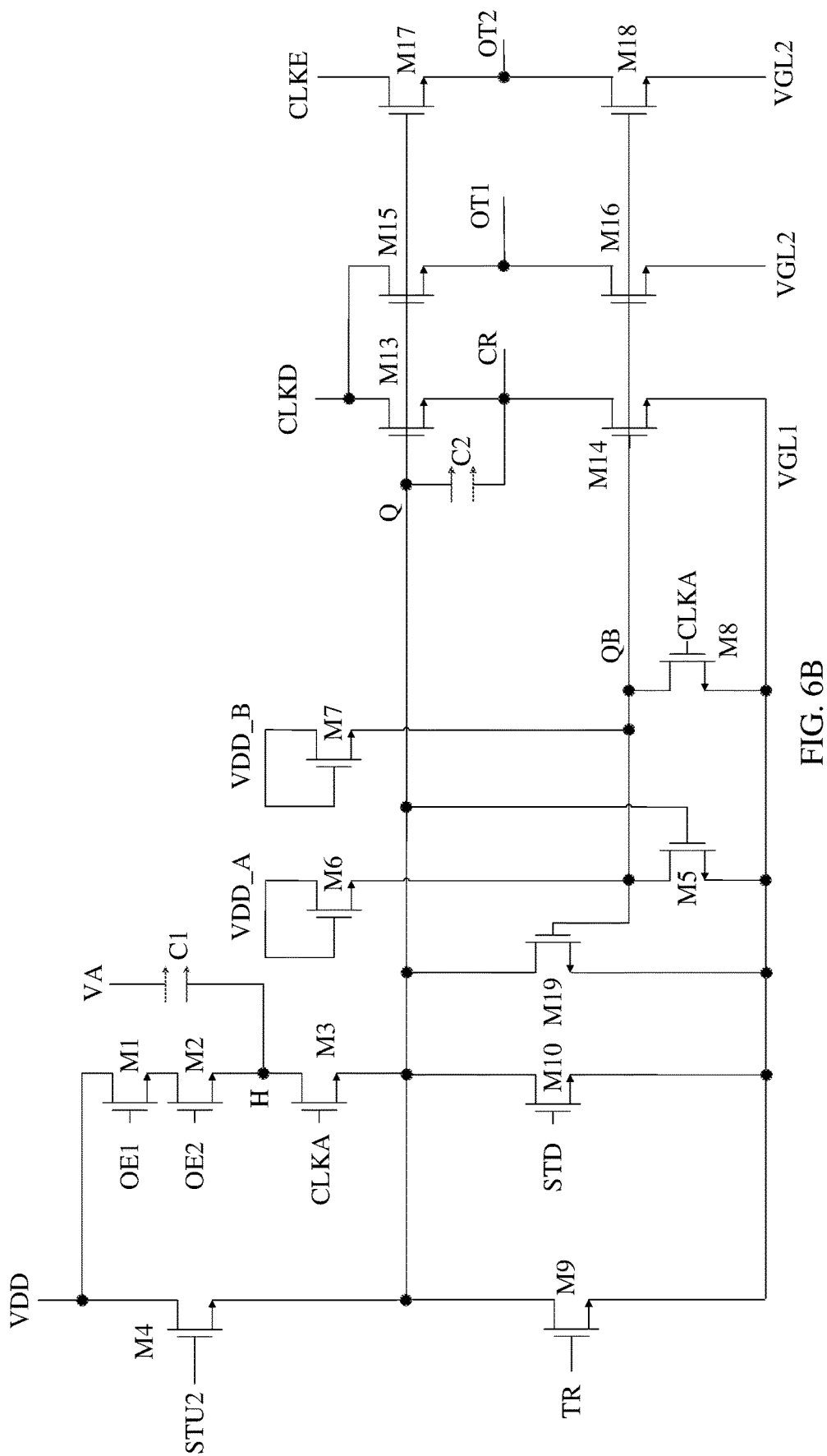
FIG. 6B is another circuit structure diagram of the shift register unit shown in FIG. 3.
Figure 6C:
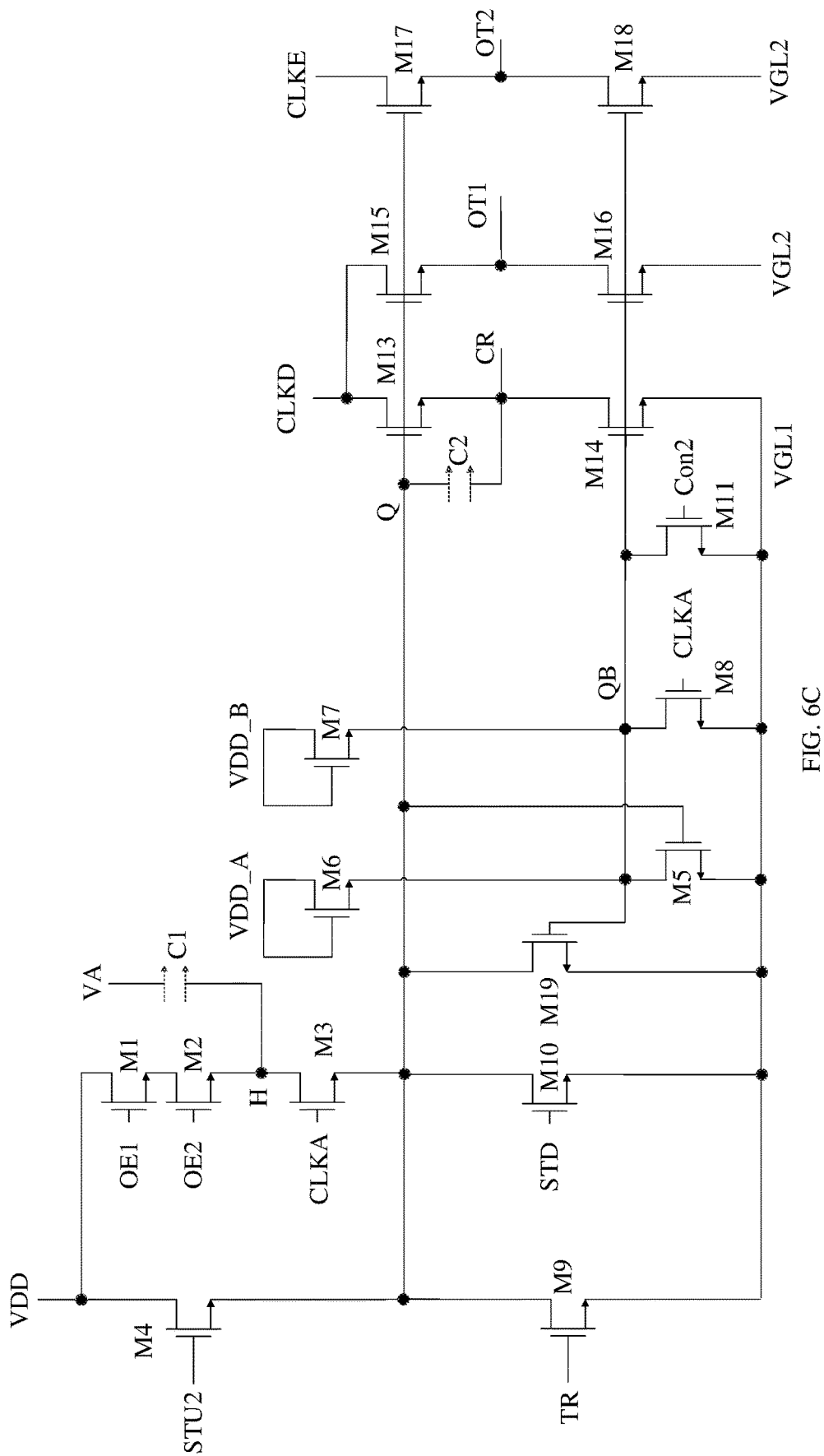
FIG. 6C is another circuit structure diagram of the shift register unit shown in FIG. 4.

FIG. 5A is a circuit structure diagram of the shift register unit shown in FIG. 2, FIG. 5B is a circuit structure diagram of the shift register unit shown in FIG. 2, FIG. 5C is a circuit structure diagram of the shift register unit shown in FIG. 4, FIG. 6A is another circuit structure diagram of the shift register unit shown in FIG. 2, FIG. 6B is another circuit structure diagram of the shift register unit shown in FIG. 3, FIG. 6C is another circuit structure diagram of the shift register unit shown in FIG. 4. In the following description of the present disclosure, a case that each transistor is an N-type transistor is taken as an example to illustrate the present disclosure, but this does not constitute a limitation on the embodiments of the present disclosure.

For example, as shown in FIG. 5A to FIG. 6C, the charging sub-circuit 110 includes a first transistor M1 and a second transistor M2. A gate electrode of the first transistor M1 is configured to be connected with the first compensation control signal end OE1 to receive the first compensation control signal, a first electrode of the first transistor M1 is configured to be connected with a blanking control signal end BP to receive the blanking control signal, a second electrode of the first transistor M1 is configured to be connected with a first electrode of the second transistor M2, a second electrode of the second transistor M2 is configured to be connected with the control node H, a gate electrode of the second transistor M2 is configured to be connected with the second compensation control signal end OE2 to receive the second compensation control signal.

For example, in examples shown in FIG. 5A to FIG. 6C, the blanking control signal end BP and the display control signal end DP can be the same signal end, and both are a sixth voltage end VDD, that is, the sixth voltage end VDD is equivalent to the aforementioned blanking control signal end BP and the display control signal end DP. For example, the sixth voltage end VDD is configured to provide a sixth voltage, and the sixth voltage is a DC high-level signal, the following embodiments are the same as those described herein, and the repeated descriptions will not be repeated again. In other words, as shown in FIG. 5A to FIG. 6C, a first electrode of the first transistor M1 is configured to be connected with the sixth voltage end VDD to receive sixth voltage, the blanking control signal can be the sixth voltage.

For example, in a case where both the first compensation control signal and the second compensation control signal are at an active level (for example, high level), the first transistor M1 and the second transistor M2 are turned on, the sixth voltage end VDD is connected with the control node H, thereby writing the sixth voltage (a high-level signal) into the control node H.

It should be noted that, in addition to the examples as shown in FIG. 5A to FIG. 6C, in the embodiments of the present disclosure, a first electrode of the first transistor M1 can also be connected with other signal end to receive the blanking control signal, which is not limited in the present disclosure.

For example, as shown in FIG. 5A to FIG. 6C, the storage sub-circuit 120 includes a first capacitor C1. A first electrode of the first capacitor C1 is configured to be connected with the control node H, a second electrode of the first capacitor C1 is configured to be connected with a first voltage end VA to receive a first voltage. For example, in the display period of one frame, the blanking control signal is written into the control node H, the first capacitor C1 stores the blanking control signal (high level), and the control node H is maintained at a high level until the blanking period of the frame.

For example, the first voltage end VA is configured to provide the first voltage, in some examples, the first voltage is a DC high-level signal; in other examples, the first voltage may be a DC low-level signal. The following embodiments are the same as those described herein, and the repeated descriptions will not be described again.

It should be noted that, in each embodiment of the present disclosure, the first capacitor C1 can be a capacitor device fabricated by a process manufacturing, for example, may be implemented by fabricating specific capacitor electrodes, and respective electrodes of the capacitor can be achieved by a metal layer, a semiconductor layer (for example, a doped polysilicon), or the like, moreover, the first capacitor C1 may also be a parasitic capacitor between the respective devices, and can be implemented by the transistor itself and other devices and circuits. The connection manner of the first capacitor C1 is not restricted to the above-described manner, and may be other suitable connection manners, as long as the blanking control signal written into the control node H can be stored. For example, in some examples, the first electrode of the first capacitor C1 is configured to be connected with the control node H, and the second electrode of the first capacitor C1 is grounded.

For example, as shown in FIG. 5A to FIG. 6C, the isolation sub-circuit 130 includes a third transistor M3. A gate electrode of the third transistor M3 is configured to be connected with the blanking input signal end STU1 to receive the blanking input signal, a first electrode of the third transistor M3 is configured to be connected with the control node H, and a second electrode of the third transistor M3 is configured to be connected with the first node Q.

For example, in the embodiments shown in FIG. 5A to FIG. 6C, a first clock signal end CLKA is equivalent to the aforementioned blanking input signal end STU1, the first clock signal end CLKA is used to provide a first clock signal, and the blanking input signal can be the first clock signal. In other words, as shown in FIG. 5A to FIG. 6C, the gate electrode of the third transistor M3 is configured to be connected with the first clock signal end CLKA. In a case where the first clock signal is at a high level, the third transistor M3 is turned on, and the control node H is connected with the first node Q, thereby writing the blanking control signal into the first node Q to pull the potential of the first node Q up to a working potential.

For example, as shown in FIG. 5A to FIG. 6C, the display input circuit 200 includes a fourth transistor M4. A gate electrode of the fourth transistor M4 is connected with a display input signal end STU2 to receive the display input signal, a first electrode of the fourth transistor M4 is connected with the display control signal end DP (i.e., the sixth voltage end VDD) to receive the display control signal (i.e., the sixth voltage), a second electrode of the fourth transistor M4 is connected with the first node Q. For example, during the display period of one frame, in a case where the display input signal is at an active level (for example, high level), the fourth transistor M4 is turned on to connect the sixth voltage end VDD with the first node Q, thereby writing the sixth voltage into the first node Q, and pulling the potential of the first node Q up to a working potential.

It should be noted that, in addition to the examples shown in FIG. 5A to FIG. 6C, in the embodiments of the present disclosure, the first electrode of the fourth transistor M4 can also be connected with other signal end to receive the display control signal, and the present disclosure is not limited thereto.

For example, as shown in FIG. 5A to FIG. 6C, the output end OP can include a shift signal output end CR and a first pixel signal output end OT1, a signal outputted by the shift signal output end CR is the same as a signal outputted by the first pixel signal output end OT1. In some examples, in a case where the shift register unit 10 shown in FIG. 5A to FIG. 6C constitutes in a cascaded manner into a gate driving circuit, a display input signal end STU2 of a (n+2)-th stage shift register unit 10 can be connected to a shift signal output end CR of a n-th stage shift register unit 10, where n is an integer larger than zero. The first pixel signal output end OT1 can be used to provide a scan drive signal for the pixel circuit.

For example, as shown in FIG. 5A to FIG. 6C, the output circuit 300 can include a first output transistor M13, a second output transistor M15, and a second capacitor C2. A gate electrode of the first output transistor M13 is connected with the first node Q, a first electrode of the first output transistor M13 is connected with the first output clock signal end CLKD to receive the first output clock signal, a second electrode of the first output transistor M13 is connected with the shift signal output end CR; a gate electrode of the second output transistor M15 is connected with the first node Q, a first electrode of the second output transistor M15 is connected with the first output clock signal end CLKD to receive the first output clock signal, a second electrode of the second output transistor M15 is connected with the first pixel signal output end OT1; a first electrode of the second capacitor C2 is connected with the first node Q, a second electrode of the second capacitor C2 is connected with the second electrode of the first output transistor M13.

For example, in a case where the first node Q is at a working potential (for example, high level), both the first output transistor M13 and the second output transistor M15 are turned on, and the first output clock signal is transmitted to the shift signal output end CR through the first output transistor M13 to be as a first output signal, the first output clock signal is transmitted to the first pixel signal output end OT1 through the second output transistor M15 to be as a second output signal.

For example, the composite output signal includes the first output signal and the second output signal, and the first output signal is the same as the second output signal. For example, the second output signal includes the display output signal and the blanking output signal described above, i.e., during the display period, a signal that is output by the first pixel signal output end OT1 is the display output signal; during the blanking period, a signal that is output by the first pixel signal output end OT1 is the blanking output signal.

It should be noted that, in each embodiment of the present disclosure, the second capacitor C2 can be a capacitor device fabricated by a process manufacture, for example, the second capacitor C2 may be implemented by fabricating specific capacitor electrodes, and respective electrodes of the capacitor can be implemented by a metal layer, a semiconductor layer (for example, a doped polysilicon), or the like, moreover, the second capacitor C2 may also be a parasitic capacitor between transistors, and can be implemented by the transistor itself and other devices and circuits, as long as the level of the first node Q can be maintained and a bootstrap function can be achieved when the shift signal output end CR or the first pixel signal output end OT1 outputs a signal.

For example, as shown in FIG. 6A to FIG. 6C, in some examples, the output end OP further comprises a second pixel signal output end OT2, and the output circuit 300 further comprises a third output transistor M17. The output circuit 300 is also connected to a second output clock signal end CLKE, and the second output clock signal end CLKE is used to output a second output clock signal.

For example, a gate electrode of the third output transistor M17 is connected with the first node Q, a first electrode of the third output transistor M17 is connected with the second output clock signal end CLKE to receive the second output clock signal, and a second electrode of the third output transistor M17 is connected with the second pixel signal output end OT2.

For example, in a case where the first node Q is at a working potential (for example, high level), the third output transistor M17 is turned on, the second output clock signal is transmitted to the second pixel signal output end OT2 via the third output transistor M17 to be as a third output signal, and the composite output signal further comprises the third output signal.

For example, in an example, a clock signal provided by the first output clock signal end CLKD and a clock signal provided by the second output clock signal end CLKE are the same, and therefore, a signal outputted by the first pixel signal output end OT1 and a signal outputted by the second pixel signal output end OT2 are the same. For example, in another example, the clock signal provided by the first output clock signal end CLKD and the clock signal provided by the second output clock signal end CLKE are different, so that the second output signal outputted by the first pixel signal output end OT1 is different from the third output signal outputted by the second pixel signal output end OT2, in order to provide various different drive signals for the pixel unit.

For example, as shown in FIG. 5A to FIG. 6C, the first control circuit 500 includes a fifth transistor M5, a sixth transistor M6, and a seventh transistor M7. A gate electrode of the fifth transistor M5 is connected with the first node Q, a first electrode of the fifth transistor M5 is connected with the second node QB, and a second electrode of the fifth transistor M5 is connected with the second voltage end VGL1 to receive the second voltage; a gate electrode of the sixth transistor M6 is connected with a first electrode of the sixth transistor M6 and is configured to be connected with a third voltage end VDD_A to receive a third voltage, and a second electrode of the sixth transistor M6 is connected with the second node QB; a gate electrode of the seventh transistor M7 is connected with a first electrode of the seventh transistor M7 and is configured to be connected with a fourth voltage end VDD_B to receive a fourth voltage, and a second electrode of the seventh transistor M7 is connected with the second node QB.

For example, in an example, the third voltage end VDD_A is configured to provide a DC low-level signal, the fourth voltage end VDD_B is configured to provide a DC high-level signal, and therefore, the sixth transistor M6 is always turned off, and the seventh transistor M7 is always turned on. For example, in another example, the third voltage end VDD_A and the fourth voltage end VDD_B are configured to alternately provide a DC high-level signal, such that the sixth transistor M6 and the seventh transistor M7 are alternately turned on to avoid a drift of performance caused by the transistors being turned on for a long period of time. For example, in a case where the third voltage end VDD_A provides a high-level signal, the fourth voltage end VDD_B provides a low-level signal, and in this case, the sixth transistor M6 is turned on, and the seventh transistor M7 is turned off; in a case where the fourth voltage end VDD_B provides a high-level signal, the third voltage end VDD_A provides a low-level signal, and in this case, the seventh transistor M7 is turned on, and the sixth transistor M6 is turned off.

For example, in a case where the first node Q is at an active level (for example, a high level), the fifth transistor M5 is turned on, by designing a proportional relationship between a width-to-length ratio of a channel of the fifth transistor M5 and a width-to-length ratio of a channel of the turned-on sixth transistor M6 or a width-to-length ratio of a channel of the turned-on seventh transistor M7, for example, the width-to-length ratio of the channel of the fifth transistor M5 is larger than any one of the width-to-length ratio of the channel of the sixth transistor M6 and the width-to-length ratio of the channel of the seventh transistor M7, and thus, the potential of the second node QB can be pulled down to a low level. In a case where the first node Q is at a low level, the fifth transistor M5 is turned off, if the sixth transistor M6 is turned on and the seventh transistor M7 is turned off, the third voltage (high level) provided by the third voltage end VDD_A is written into the second node QB through the sixth transistor M6, thereby pulling the potential of the second node QB up to a high level; if the sixth transistor M6 is turned off and the seventh transistor M7 is turned on, the fourth voltage (high level) provided by the fourth voltage end VDD_B is written into the second node QB through the seventh transistor M7, thereby pulling the potential of the second node up to a high level.

For example, as shown in FIG. 5A to FIG. 6C, the noise reduction circuit 400 can include a first noise reduction transistor M19, a second noise reduction transistor M14, and a third noise reduction transistor M16. A gate electrode of the first noise reduction transistor M19 is connected with the second node QB, a first electrode of the first noise reduction transistor M19 is connected with the first node Q, a second electrode of the first noise reduction transistor M19 is connected with the second voltage end VGL1 to receive the second voltage; A gate electrode of the second noise reduction transistor M14 is connected with the second node QB, a first electrode of the second noise reduction transistor M14 is connected with shift signal output end CR, a second electrode of the second noise reduction transistor M14 is connected with the second voltage end VGL1 to receive the second voltage; a gate electrode of the third noise reduction transistor M16 is connected with the second node Q, a first electrode of the third noise reduction transistor M16 is connected with the first pixel signal output end OT1, a second electrode of the third noise reduction transistor M16 is connected with the fifth voltage end VGL2 to receive the fifth voltage.

For example, the fifth voltage end VGL2 is configured to provide the fifth voltage, and the fifth voltage is a DC low-level signal (for example, a level of the fifth voltage is lower than or equal to a low level of the clock signal), for example, the fifth voltage end VGL2 can be grounded, and the following embodiments are the same as those described herein, and the repeated descriptions will not be repeated again. For example, in an example, the fifth voltage provided by the fifth voltage end VGL2 is higher than the second voltage provided by the second voltage end VGL1, for example, the second voltage is −10V, and the fifth voltage is −6V; in another example, the fifth voltage of the fifth voltage end VGL2 is equal to the second voltage of the second voltage end VGL1, so that the shift register unit 10 may not be provided with the fifth voltage end VGL, while the second electrode of the third noise reduction transistor M16 is connected with the second voltage end VGL1 to receive the second voltage. The fifth voltage and the second voltage may be the same or different, which can depends on the actual requirements. Embodiments of the present disclosure are not limited thereto.

For example, in a case where the second node QB is at an active level (for example, high level), the first noise reduction transistor M19, the second noise reduction transistor M14, and the third noise reduction transistor M16 are all turned on, and both the first node Q and the shift signal output end CR are connected with the second voltage end VGL1, thereby pulling the potential of the first node Q and the potential of the shift signal output end CR down to a low potential by the second voltage of the second voltage end VGL1, and the first pixel signal output end OT1 is connected with the fifth voltage end VGL2, thereby pulling the potential of the first pixel signal output end OT1 down to a low potential by the fifth voltage of the fifth voltage end VGL2, thus decreasing noise of the first node Q, the shift signal output end CR, and the first pixel signal output end OT1. It should be noted that, in each embodiment of the present disclosure, in a case where the output end OP includes a plurality of first pixel signal output ends OT1 and/or a plurality of shift signal output ends CR, the noise reduction circuit 400 also correspondingly includes a plurality of transistors connected in one-to-one correspondence with the plurality of shift signal output ends CR and/or the plurality of first pixel signal output ends OT1, so as to perform noise reduction on the plurality of shift signal output ends CR and/or the plurality of first pixel signal output ends OT1.

For example, as shown in FIG. 6A to FIG. 6C, in some examples, in a case where the output end OP further comprises a second pixel signal output end OT2, the noise reduction circuit 400 further comprises a fourth noise reduction transistor M18. A gate electrode of the fourth noise reduction transistor M18 is connected with the second node QB, a first electrode of the fourth noise reduction transistor M18 is connected with the second pixel signal output end OT2, and a second electrode of the fourth noise reduction transistor M18 is connected with the fifth voltage end VGL2 to receive the fifth voltage. For example, in a case where the second node QB is at an active level (for example, high level), the fourth noise reduction transistor M18 is turned on, the second pixel signal output end OT2 is connected with the fifth voltage end VGL2, so that the potential of the second pixel signal output end OT2 is pulled down to a low potential by the fifth voltage of the fifth voltage end VGL2, thereby decreasing the noise of the second pixel signal output end OT2.

For example, as shown in FIG. 5B, FIG. 5C, FIG. 6B, and FIG. 6C, the second control circuit 600 includes an eighth transistor M8, the first clock signal end CLKA provides the first clock signal, and the first control signal includes the first clock signal, i.e., the first clock signal end CLKA is equivalent to the aforementioned blanking pull-down control end Con1. A gate electrode of the eighth transistor M8 is connected with the first clock signal end CLKA to receive the first clock signal, a first electrode of the eighth transistor M8 is connected with the second node QB, and a second electrode of the eighth transistor M8 is connected with the second voltage end VGL1 to receive the second voltage. For example, during the blanking period of one frame, in a case where the first clock signal is at an active level (for example, high level), the eighth transistor M8 is turned on, the second node QB is connected with the second voltage end VGL1, and the second voltage provided by the second voltage end VGL1 is written into the second node QB, thereby pulling the second node QB down to a low level.

For example, as shown in FIG. 5C and FIG. 6C, the third control circuit 700 includes an eleventh transistor M11. A gate electrode of the eleventh transistor M11 is configured to be connected to the display pull-down control end Con2 to receive the second control signal, a first electrode of the eleventh transistor M11 is configured to be connected to the second node QB, a second electrode of the eleventh transistor M11 is configured to be connected to the second voltage end VGL1 to receive the second voltage. For example, during the display period of one frame, in a case where the second control signal is at an active level (for example, high level), the eleventh transistor M11 is turned on, the second node QB is connected with the second voltage end VGL1, and the second voltage provided by the second voltage end VGL1 is written into the second node QB, thereby pulling the second node QB down to a low level.

For example, in an example, in a case where the plurality of shift register units 10 are cascaded, a shift signal output end CR of a (m1)-th stage shift register unit 10 is connected with a second control signal end Con2 of a (m1+2)-th stage shift register unit 10, so that an output signal of the shift signal output end CR of the (m1)-th stage shift register unit 10 serves as a second control signal of the (m1+2)-th stage shift register unit 10. Herein, m1 is an integer larger than zero. Of course, the embodiments of the present disclosure are not limited thereto, the display pull-down control end Con2 can also be connected with an individually disposed signal line.

For example, as shown in FIG. 5A to FIG. 6C, the blanking reset circuit 800 includes a ninth transistor M9. A gate electrode of the ninth transistor M9 is connected with the blanking reset signal end TR to receive the blanking reset signal, a first electrode of the ninth transistor M9 is connected with the first node Q, and a second electrode of the ninth transistor M9 is connected with the second voltage end VGL1 to receive the second voltage. For example, during the blanking period of one frame, in a case where the blanking reset signal is at an active level (for example, high level), the ninth transistor M9 is turned on, the first node Q is connected with the second voltage end VGL1, and the second voltage provided by the second voltage end VGL1 is written into the second node QB, thereby achieving resetting of the first node Q.

For example, as shown in FIG. 5A to FIG. 6C, the display reset circuit 900 includes a tenth transistor M10. A gate electrode of the tenth transistor M10 is connected with the display reset signal end STD to receive the display reset signal, a first electrode of the tenth transistor M10 is connected with the first node Q, and a second electrode of the tenth transistor M10 is connected with the second voltage end VGL1 to receive the second voltage. For example, during the display period of one frame, in a case where the display reset signal is at an active level (for example, high level), the tenth transistor M10 is turned on, the first node Q is connected with the second voltage end VGL1, and the second voltage provided by the second voltage end VGL1 is written into the second node QB, thereby achieving resetting of the first node Q.

For example, in an example, in a case where the plurality of shift register units 10 are cascaded, a shift signal output end CR of a (m2+3)-th stage shift register unit 10 is connected with a display reset signal end STD of a (m2)-th stage shift register unit 10, so that an output signal of the shift signal output end CR of the (m2+3)-th stage shift register unit 10 serves as a display reset signal of the (m2)-th stage the shift register unit 10. Herein, m2 is an integer larger than zero. Of course, the embodiments of the present disclosure are not limited thereto, the display reset signal end STD can also be connected with an individually disposed signal line.

It should be noted that, those skilled in the art can understand that, in the embodiments of the present disclosure, specific implementations of the blanking input circuit 100, the display input circuit 200, the output circuit 300, the noise reduction circuit 400, the first control circuit 500, the second control circuit 600, the third control circuit 700, the blanking reset circuit 800, the display reset circuit 900, and the like are not restricted to the above-described manners, for example, may be any suitable implementations, such as a conventional connection manner well known by those skilled in the art, provided that it needs to be ensured that the corresponding functions can be achieved. The protective scope of the present disclosure cannot be limited to the aforementioned examples. In practical applications, the skilled person can choose to use or not use one or more of the aforementioned circuits depending on circumstances, the various combined variants based on the aforementioned circuits are not deviated from the principle of the present disclosure and will not be repeated.

Figure 7:
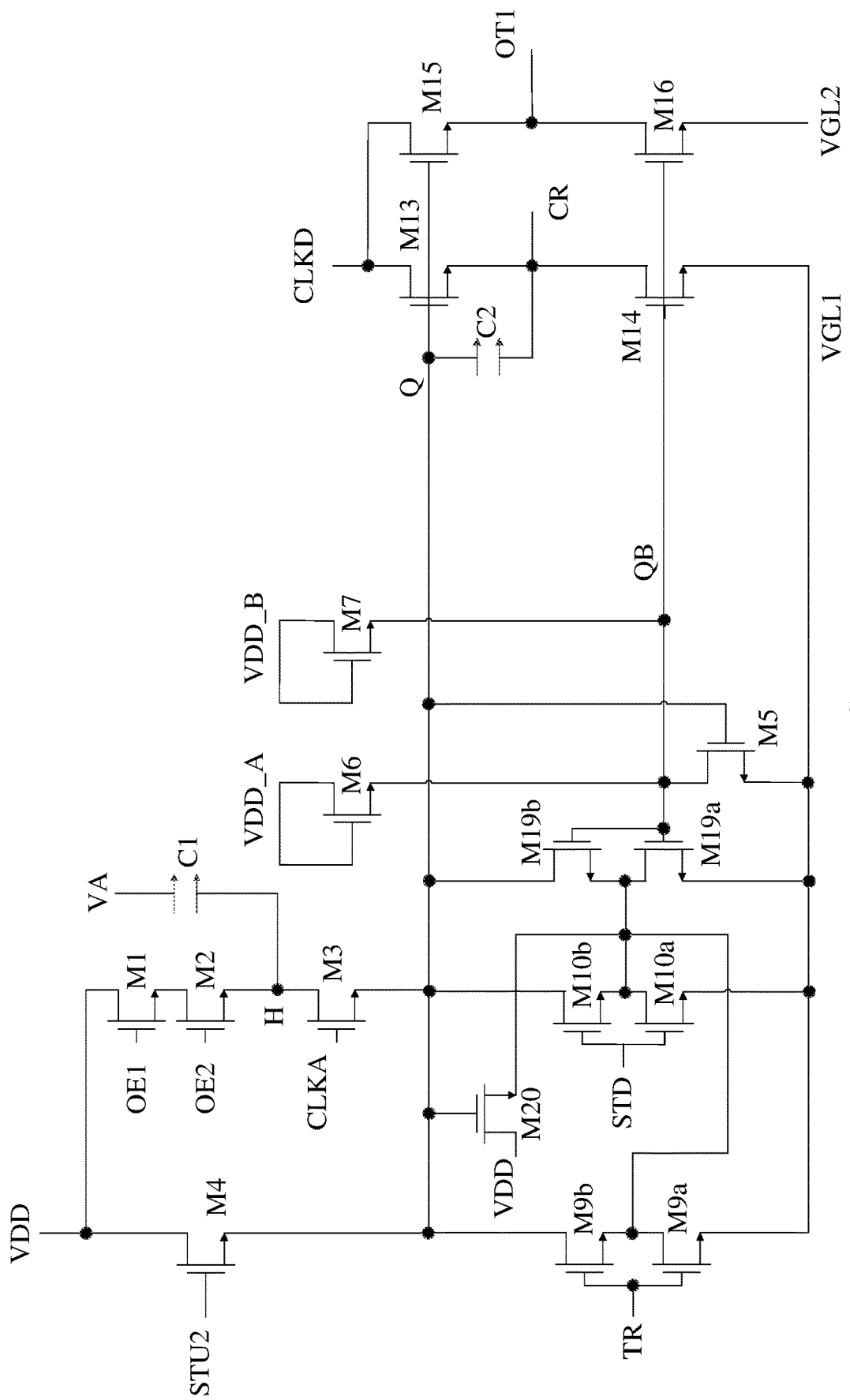
FIG. 7 is yet another circuit structure diagram of the shift register unit shown in FIG. 2.

FIG. 7 is yet another circuit structure diagram of the shift register unit shown in FIG. 2. For example, as shown in FIG. 7, in addition to further including leakage-prevention circuits, the shift register unit 10 in this embodiment is substantially the same as the shift register unit 10 described in FIG. 5A. In the shift register unit 10 shown in FIG. 5A, the potential of the first node Q can be maintained by using the second capacitor C2. For example, as shown in FIG. 5A, in a case where the potential of the first node Q is maintained at a high level, the first electrodes of some transistors (for example, the ninth transistor M9, the tenth transistor M10, and the first noise reduction transistor M19) of the shift register unit 10 are connected to the first node Q, the second electrodes of these transistors are connected to a low-level signal line. Even though in a case where gates electrode of these transistors receive non-conductive signals, because there is a voltage difference between the first electrodes and the second electrodes of these transistors, a phenomenon of leakage may also occur, so that an effect of maintaining the potential of the first node Q is deteriorated. Therefore, the shift register unit 10 shown in FIG. 7 adds the leakage prevention circuits to ameliorate the effect of maintaining the potential of the first node Q.

For example, as shown in FIG. 7, a first leakage prevention circuit can include a first leakage prevention transistor M20, a second leakage prevention transistor M9b, a third leakage prevention transistor M10b, and a fourth leakage prevention transistor M19b. The first leakage prevention circuit is configured to, when the first node Q is at a high level, prevent the charges at the first node Q from leaking to the second voltage end VGL1 via a ninth transistor M9a, a tenth transistor M10a, and a first noise reduction transistor M19a. Taking the second leakage prevention transistor M9b as an example, a gate electrode of the second leakage prevention transistor M9b is connected to a gate electrode of the ninth transistor M9a (i.e., the gate electrode of the second leakage prevention transistor M9b is connected to the blanking reset signal end TR), a first electrode of the second leakage prevention transistor M9b is connected to the first node Q, a second electrode of the second leakage prevention transistor M9b is connected to a first electrode of the ninth transistor M9a, and the second electrode of the second leakage prevention transistor M9b is also connected to a second electrode of the first leakage prevention transistor M20. A gate electrode of the first leakage prevention transistor M20 is connected to the first node Q, and a first electrode of the first leakage prevention transistor M20 is connected to the sixth voltage end VDD.

For example, in a case where the first node Q is at a high level, the first leakage prevention transistor M20 is turned on under control of the first node Q, and writes the sixth voltage (high voltage) into the second electrode of the second leakage prevention transistor M9b, so that both the first electrode and the second electrode of the second leakage prevention transistor M9b are at a high-level state, to prevent the charges at the first node Q from leaking through the ninth transistor M9a. At this time, because the gate electrode of the ninth transistor M9a is connected with the gate electrode of the second leakage prevention transistor M9b, and therefore, a combination of the ninth transistor M9a with the second leakage prevention transistor M9b can achieve the same function as the ninth transistor M9a as shown in FIG. 5A to FIG. 6C, and at the same time have a leakage prevention effect. Similarly, a principle of preventing leakage of electricity using the third leakage prevention transistor M10b and the fourth leakage prevention transistor M19b is similar to a principle of preventing leakage of electricity using the second leakage prevention transistor M9b, and details are not be repeated herein.

It should be noted that, those skilled in the art can understand that, the embodiments of the circuit having a leakage prevention function provided according to the embodiments of the present disclosure can select one or more transistors of the shift register unit 10 to add a leakage prevention circuit structure according to practical circumstances. FIG. 7 only shows one exemplary circuit structure including a leakage prevention circuit, and does not constitute a limitation on the embodiments of the present disclosure. Furthermore, in the descriptions of each embodiment of the present disclosure, the first node Q, the second node QB, the control node H, and the like do not denote actual existing components, but denote junction points of the relevant connections in the circuit diagram.

It should be noted that, the transistors adopted in embodiments of the present disclosure can all be thin film transistors, field effect transistors, or other switching devices with the same characteristics, and the embodiments of the present disclosure are described by taking the thin film transistors as an example. A source electrode and a drain electrode of the transistors adopted herein may be symmetrical in structure, so the source electrode and the drain electrode of the transistor may have no difference in structure. In the embodiments of the present disclosure, in order to distinguish two electrodes of the transistor except a gate electrode, one of the two electrodes is directly described as a first electrode, and the other of the two electrodes is directly described as a second electrode.

In addition, the transistors in the embodiments of the present disclosure are all described by taking the N-type transistors as an example, in this case, the first electrode of the transistor is a drain electrode, and the second electrode of the transistor is a source electrode. It should be noted that, the present disclosure includes but is not limited thereto. For example, one or more transistors in the shift register unit 10 provided by the embodiments of the present disclosure can also adopt P-type transistors, in this case, the first electrode of the transistor is a source electrode, and the second electrode of the transistor is a drain electrode, so long as respective electrodes of a selected-type transistor are correspondingly connected with reference to respective electrodes of a corresponding transistor in the embodiment of the present disclosure, and the corresponding voltage ends can provide a corresponding high voltage or low voltage. When adopting the N-type transistor, Indium Gallium Zinc Oxide (IGZO) can be adopted as an active layer of the thin film transistor, which may effectively reduce the size of the transistor and prevent leakage current compared with adopting a Low Temperature Poly Silicon (LTPS) or amorphous silicon (for example, hydrogenated amorphous silicon) as the active layer of the thin film transistor.

Figure 8:
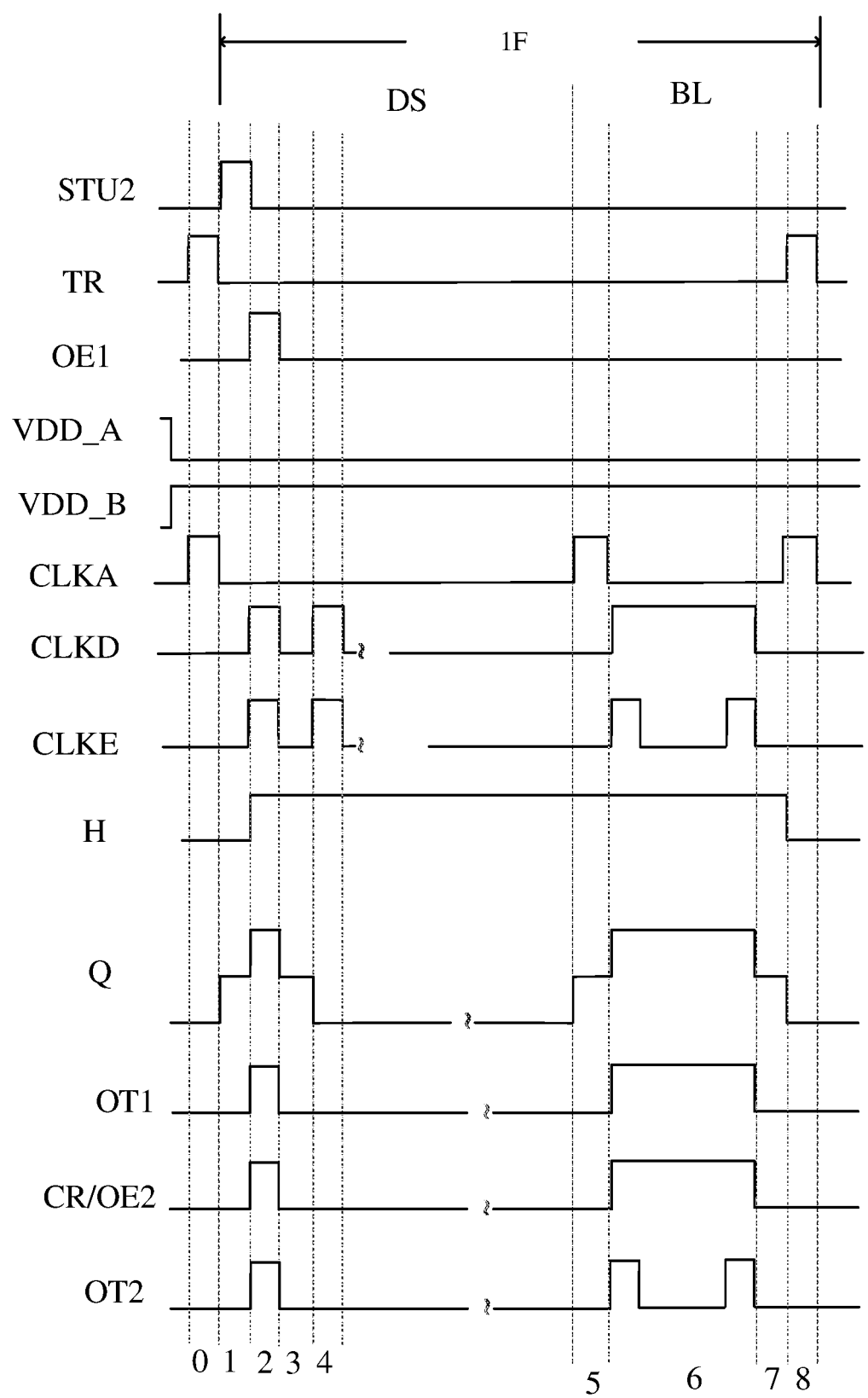
FIG. 8 is a signal timing sequence diagram of a shift register unit provided by some embodiments of the present disclosure.

FIG. 8 is a signal timing sequence diagram of a shift register unit provided by some embodiments of the present disclosure. The working principle of the shift register unit 10 shown in FIG. 6A is illustrated below in conjunction with the signal timing sequence diagram shown in FIG. 8, and here the description will be made by taking a case that each transistor is a N-type transistor an example, but the embodiments of the present disclosure is not limited thereto.

In FIG. 8 and the following description, 1F denotes a timing sequence of the first frame. DS denotes a display period of one frame, and BL denotes a blanking period of one frame. STU1, STU2, TR, VDD_A, VDD_B, CLKA, CLKD, CLKE, OT1, OT2, CR, and the like are not only used to denote the respective signal ends, but also used to denote the respective signals. The following embodiments are the same as those described herein, and the repeated descriptions will not be repeated again.

For example, in an initial phase 0, the blanking reset signal TR and the first clock signal CLKA are at a high level, the ninth transistor M9 is turned on, and the second voltage of the second voltage end VGL1 is written into the first node Q via the ninth transistor M9 to reset the first node Q. The third voltage VDD_A is a low-level signal, and the fourth voltage VDD_B is a high-level signal, and therefore, the sixth transistor M6 is turned off, the seventh transistor M7 is turned on, the fourth voltage VDD_B is written into the second node QB via the seventh transistor M7, the potential of the second node QB is pulled up to a high level, and thus the first noise reduction transistor M19 is turned on, thereby assisting in pulling down the first node Q, so that the potential of the first node Q is a low level. The third transistor M3 is also turned on, and thus the control node H is also reset.

For example, during the display period DS, in a first phase 1, the display input signal end STU2 is at a high level, and the fourth transistor M4 is turned on, the display control signal (for example, the high-level sixth voltage provided by the sixth voltage end VDD) is written into the first node Q via the fourth transistor M4 and stored by the second capacitor C2. Both the display reset signal STD (not shown) and the first clock signal CLKA are low level signals, and both the tenth transistor M10 and the third transistor M3 are turned off. Because the first node Q is at a high level, the first output transistor M13, the second output transistor M15, and the third output transistor M17 are all turned on, the first output clock signal CLKD is output to the shift signal output end CR and the first pixel signal output end OT1via the first output transistor M13 and the second output transistor M15, respectively, and the second output clock signal CLKE is output to the second pixel signal output end OT2 via the third output transistor M17. However, because both the first output clock signal CLKD and the second output clock signal CLKE are low level signals, i.e., the shift signal output end CR, the first pixel signal output end OT1, and the second pixel signal output end OT2 all output low-level signals. In addition, because the first node Q is at a high level, the fifth transistor M5 is turned on, thereby pulling the potential of the second node QB down to a low level.

For example, in a second phase 2, the first node Q remains as a high level, the first output transistor M13, the second output transistor M15, and the third output transistor M17 remain turned on, both the first output clock signal CLKD and the second output clock signal CLKE become high levels, and thus the shift signal output end CR, the first pixel signal output end OT1, and the second pixel signal output end OT2 all output high-level signals, due to the bootstrap effect of the second capacitor C2, the potential of the first node Q is further pulled up, and the first output transistor M13, the second output transistor M15, and the third output transistor M17 are turned on more sufficiently. For example, a high-level signal outputted by the shift signal output end CR can be used for the scan shift between an upper stage shift register unit and a lower stage shift register unit, and high-level signals outputted from the first pixel signal output end OT1 and the second pixel signal output end OT2 can be used to drive the sub-pixel units in the display panel to perform display.

For example, in the example shown in FIG. 6A, a second compensation control signal end OE2 of a current stage shift register unit can be connected with a shift signal output end CR of the current stage shift register unit. In the second phase 2, the first compensation control signal OE1 is a high-level signal, the first transistor M1 is turned on, and a signal outputted by the shift signal output end CR is also a high-level signal, that is, the second compensation control signal OE2 is a high-level signal, and thus the second transistor M2 is also turned on, and the blanking control signal (for example, the high-level sixth voltage provided by the sixth voltage end VDD) is written into the control node H via the first transistor M1 and the second transistor M2, and a level of the control node H becomes a high level. It should be noted that, the first capacitor C1 can store the high-level blanking control signal and hold the high-level blanking control signal until the end of the display period of one frame, so as to use hat the high-level blanking control signal during the blanking period.

For example, in a third phase 3, the first output clock signal CLKD and the second output clock signal CLKE become low levels, and both the shift signal output end CR and the first pixel signal output end OT1 can be discharged through the first output clock signal end CLKD, thereby completing the resetting of the shift signal output end CR and the first pixel signal output end OT1; and the second pixel signal output end OT2 is discharged through the second output clock signal end CLKE, thereby completing the resetting of the second pixel signal output end OT2. At this time, the shift signal output end CR, the first pixel signal output end OT1, and the second pixel signal output end OT2 all output low-level signals, and due to the bootstrap action of the second capacitor C2, the potential of the first node Q reduces to some extend but still remains the high level, the first output transistor M13, the second output transistor M15, and the third output transistor M17 remain turned on, and a low level of the first output clock signal end CLKD is output to the shift signal output end CR and the first pixel signal output end OT1, and a low level of the second output clock signal end CLKE is output to the second pixel signal output end OT2, thereby achieving the resetting of the output end OP.

For example, in a fourth phase 4, the display reset signal STD (not shown) is a high-level signal, and the tenth transistor M10 is turned on, so that the second voltage of the second voltage end VGL2 is written into the first node Q to reset the first node Q. A level of the first node Q becomes a low level, so that the fifth transistor M5 is turned off, the third voltage VDD_A is a high-level signal, the fourth voltage VDD_B is a low-level signal, and thus, the sixth transistor M6 is turned off, and the seventh transistor M7 is turned on, so that the fourth voltage VDD_B is written into the second node QB via the seventh transistor M7, the second node QB is pulled up to a high level, and therefore, the first noise reduction transistor M19 is turned on, to further perform noise reduction on the first node Q. The second noise reduction transistor M14, the third noise reduction transistor M16, and the fourth noise reduction transistor M18 are also turned on under control of the high level of the second node QB, thereby performing the noise reduction on the shift signal output end CR, the first pixel signal output end OT1, and the second pixel signal output end OT2.

For example, in the first phase 1 to the fourth phase 4 described above, because the first clock signal CLKA is always kept the low level, the third transistor M3 is at a turn-off state, thereby isolating the control node H and the first node Q to prevent the level of the control node H from affecting the output signal of the display period. As shown in FIG. 8, the level of the first node Q presents a tower-shaped waveform, and the pulling-up and the resetting of the output signal of the shift signal output end CR are achieved by the first output transistor M13, and the pulling-up and the resetting of the output signal of the first pixel signal output end OT1 are achieved by the second output transistor M15, and the pulling-up and the resetting of the output signal of the second pixel signal output end OT2 are achieved by the third output transistor M17, the second noise reduction transistor M14 plays an assisting pulling-down effect on the output signal of the shift signal output end CR, the third noise reduction transistor M16 plays an assisting pulling-down effect on the output signal of the first pixel signal output end OT1, and the fourth noise reduction transistor M18 plays an assisting pulling-down effect on the output signal of the second pixel signal output end OT2, so that a volume of the second noise reduction transistor M14, a volume of the third noise reduction transistor M16, a volume of and the fourth noise reduction transistor M18 can be reduced, which is advantageous for reducing an area of the circuit layout.

For example, during the blanking period BL, in a fifth phase 5, the control node H still remains at a high level due to a holding action of the first capacitor C1, meanwhile, the first clock signal CLKA is a high-level signal, and the third transistor M3 is turned on. The blanking control signal charges the first node Q via the third transistor M3, thereby pulling the first node Q up to a high potential. The fifth transistor M5 is turned on under control of the first node Q, and the second node QB is pulled down to a low level. Because the level of the first node Q is a high level, the first output transistor M13, the second output transistor M15, and the third output transistor M17 are all turned on, and the first output clock signal CLKD is output to the shift signal output end CR and the first pixel signal output end OT1 via the first output transistor M13 and the second output transistor M15, respectively, and the second output clock signal CLKE is output to the second pixel signal output end OT2 via the third output transistor M17. However, because both the first output clock signal CLKD and the second output clock signal CLKE are low level signals, i.e., the shift signal output end CR, the first pixel signal output end OT1, and the second pixel signal output end OT2 all output low-level signals.

For example, in a sixth phase 6, the first clock signal CLKA becomes a low level, and the third transistor M3 is turned off, so that the first node Q does not leak through the third transistor M3. The first node Q remains at a high level, the first output transistor M13, the second output transistor M15, and the third output transistor M17 remain turned on, and the first output clock signal CLKD becomes a high level, and thus both the shift signal output end CR and the first pixel signal output end OT1 output high-level signals. Due to the bootstrap effect of the second capacitor C2, the potential of the first node Q is further pulled up, the first output transistor M13, the second output transistor M15, and the three output transistor M17 are more sufficiently turned on. For example, the signal output by the first pixel signal output end OT1 can be used to drive a sensing transistor in the sub-pixel unit in the display panel to achieve external compensation. Because the second output clock signal CLKE outputs a pulse signal, the second pixel signal output end OT2 also outputs a pulse signal. It should be noted that, in the sixth phase 6, the signal output by the second pixel signal output end OT2 can be designed according to the actual application, which is not limited in the present disclosure.

For example, in a seventh phase 7, the first output clock signal CLKD and the second output clock signal CLKE become a low level, and both the shift signal output end CR and the first pixel signal output end OT1 can be discharged through the first output clock signal end CLKD, thereby completing the resetting of the shift signal output end CR and the first pixel signal output end OT1; the second pixel signal output end OT2 is discharged through the second output clock signal end CLKE, thereby completing the resetting of the second pixel signal output end OT2. In this case, the shift signal output end CR, the first pixel signal output end OT1, and the second pixel signal output end OT2 all output low-level signals, and due to the bootstrap action of the second capacitor C2, the potential of the first node Q somewhat reduces but still remains the high level, the first output transistor M13, the second output transistor M15, and the third output transistor M17 remain turned on, and the low level of the first output clock signal end CLKD is output to the shift signal output end CR and the first pixel signal output end OT1, and the low level of the second output clock signal end CLKE is output to the second pixel signal output end OT2, thereby achieving the resetting of the output end OP.

For example, in an eighth phase 8, the blanking reset signal TR and the first clock signal CLKA are at a high level, and the ninth transistor M9 is turned on, the second voltage of the second voltage end VGL1 is written into the first node Q via the ninth transistor M9 to reset the first node Q, the third transistor M3 is also turned on, the second voltage of the second voltage end VGL1 is written into the control node H via the ninth transistor M9 and the third transistor M3, and thus the control node H is also reset. In this way, a period of time when the control node H is at a high level can be short, so as to reduce the risk of drift (e.g., positive drift) of threshold voltage of the transistor connected to the control node H, which helps to improve the reliability of the circuit.

It should be noted that, in the above description with regards to the working process of the display period DS and the working process of the blanking period BL, the shift register unit including two pixel signal output ends (i.e., the first pixel signal output end OT1 and the second pixel signal output end OT2) is taken as an example, but the present disclosure is not limited thereto, and the shift register unit may include only one pixel signal output end (for example, the first pixel signal output end OT1). In a case where the shift register unit can only include the first pixel signal output end OT1, the working process of the shift register unit is similar to the above working process, as long as the relevant description about the second pixel signal output end OT2 is omitted, and the details will not be repeated again here.

It is noteworthy that, in the embodiments of the present disclosure, for example, in a case where the respective circuits are implemented as N-type transistors, the term "pull up" means charging a node or an electrode of a transistor such that an absolute value of a level of the node or a level of the electrode is raised to achieve an operation of a corresponding transistor (e.g., turn on); and the term "pull down" means discharging a node or an electrode of a transistor such that an absolute value of a level of the node or a level of the electrode is reduced to achieve an operation of a corresponding transistor (e.g., turn off). The term "working potential" denotes that a node is at a high potential, so that a transistor is turned on when a gate electrode of the transistor is connected to the node; the term "non-working potential" denotes that a node is at a low potential, so that a transistor is turned off when a gate electrode of the transistor is connected to the node. For another example, in a case where the respective circuits are implemented as P-type transistors, the term "pull up" means discharging a node or an electrode of a transistor such that an absolute value of a level of the node or a level of the electrode is reduced to achieve an operation of a corresponding transistor (e.g., turn on); and the term "pull down" means charging a node or an electrode of a transistor such that an absolute value of a level of the node or a level of the electrode is raised to achieve an operation of a corresponding transistor (e.g., turn off). The term "working potential" denotes that a node is at a low potential, so that a transistor is turned on when a gate electrode of the transistor is connected to the node; the term "non-working potential" denotes that a node is at a high potential, so that a transistor is turned off when a gate electrode of the transistor is connected to the node.

At least some embodiments of the present disclosure also provide a gate driving circuit. The gate driving circuit includes the shift register unit of any one of the embodiments of the present disclosure. A circuit structure of the gate driving circuit is simple, the gate driving circuit can achieve random compensation, thereby avoiding a scan line and brightness deviation of a panel caused by progressive sequential compensation, improving display uniformity, and improving a display effect.

Figure 9:
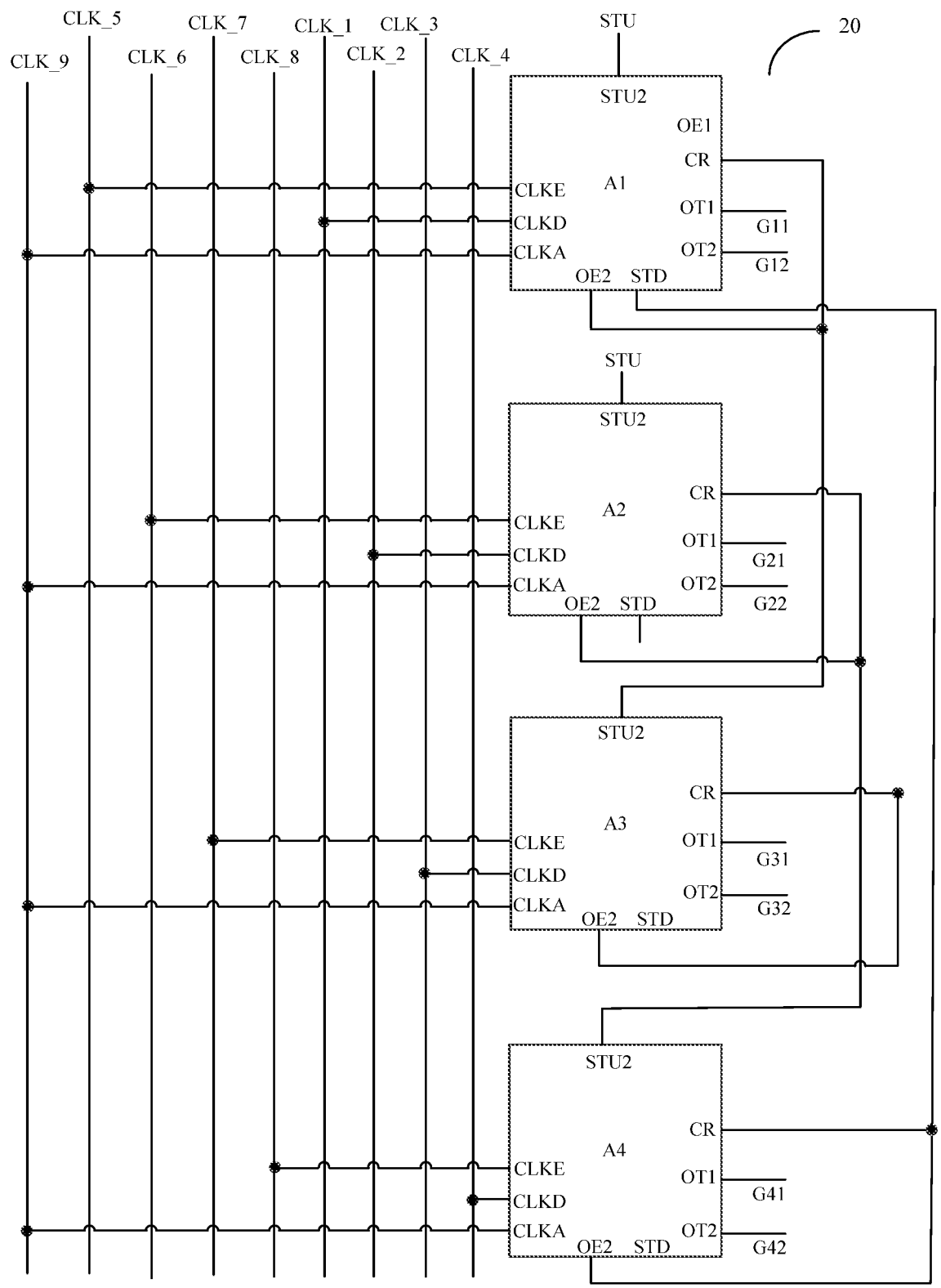
FIG. 9 is a schematic block diagram of a gate driving circuit provided by some embodiments of the present disclosure.
Figure 10A:
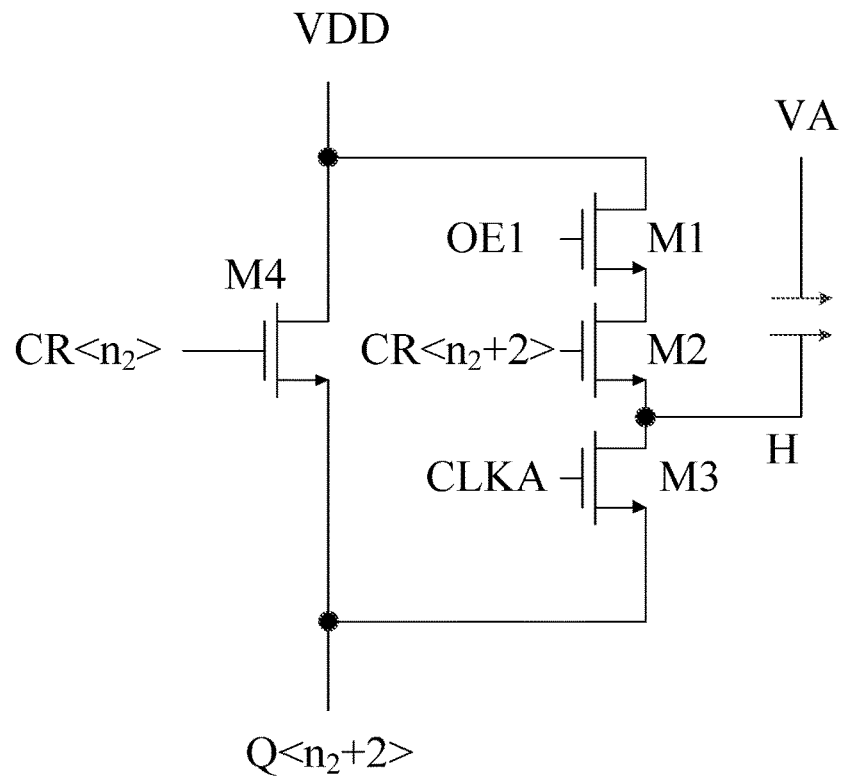
FIG. 10A is a circuit structure diagram of a blanking input circuit and a display input circuit provided by some embodiments of the present disclosure.
Figure 10B:
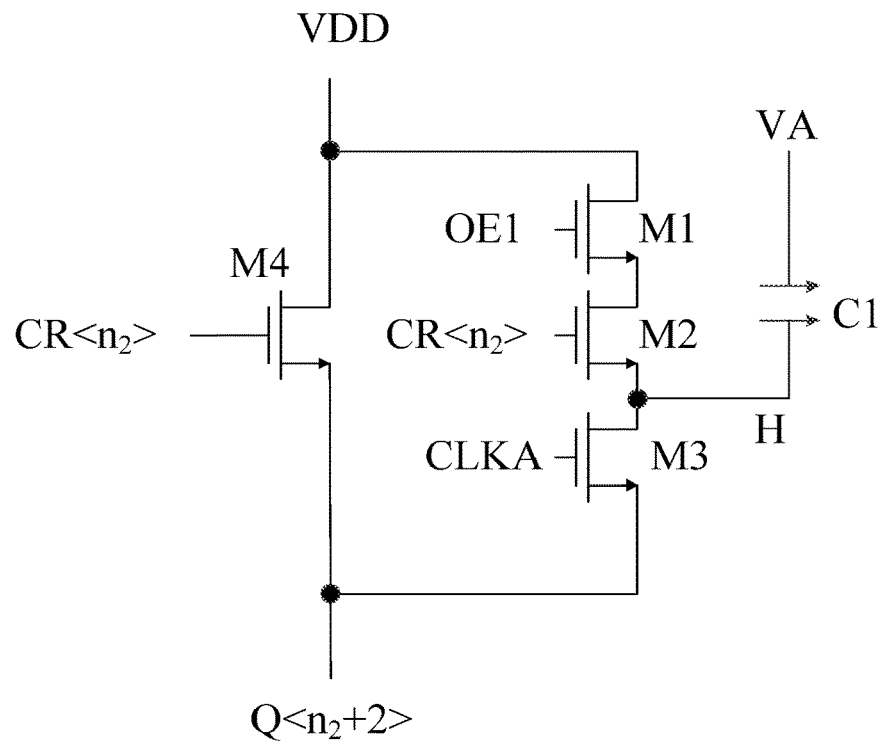
FIG. 10B is a circuit structure diagram of another blanking input circuit and another display input circuit provided by some embodiments of the present disclosure.
Figure 10C:
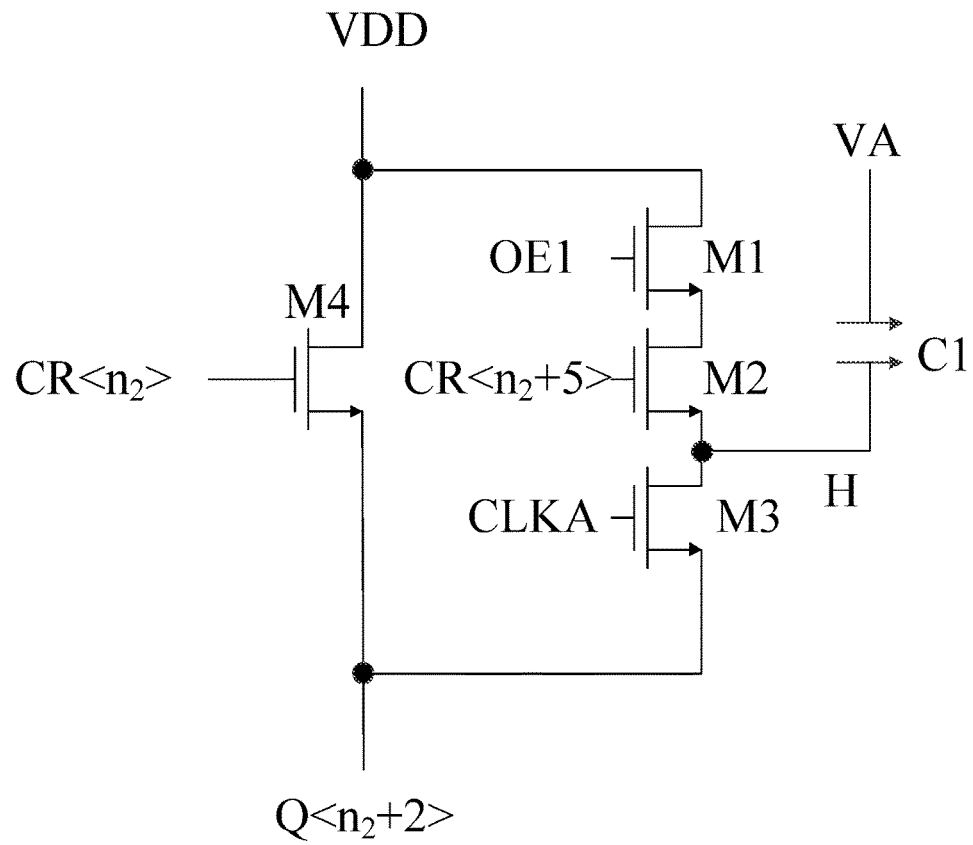
FIG. 10C is a circuit structure diagram of a blanking input circuit and a display input circuit provided by some other embodiments of the present disclosure.
Figure 10D:
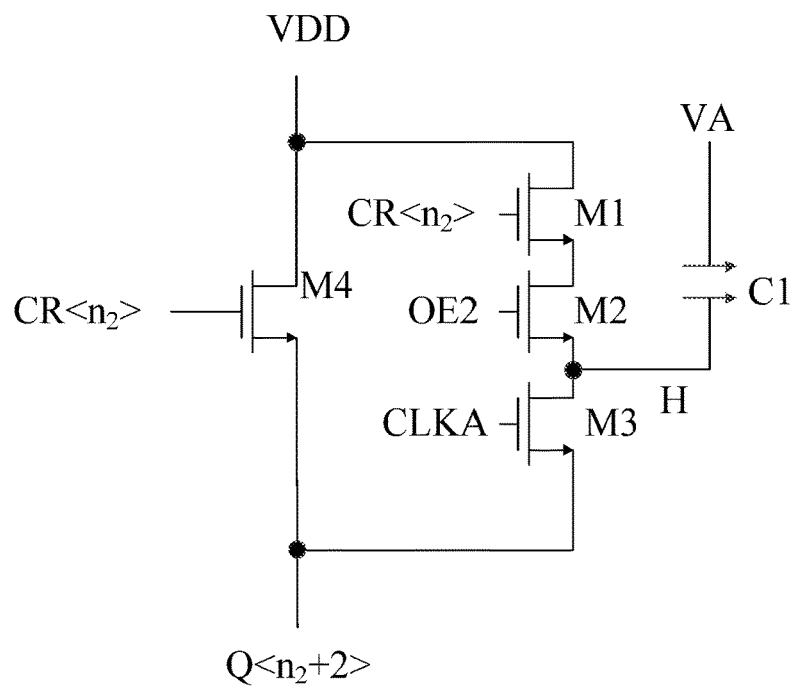
FIG. 10D is a circuit structure diagram of another blanking input circuit and another display input circuit provided by some other embodiments of the present disclosure.
Figure 10E:
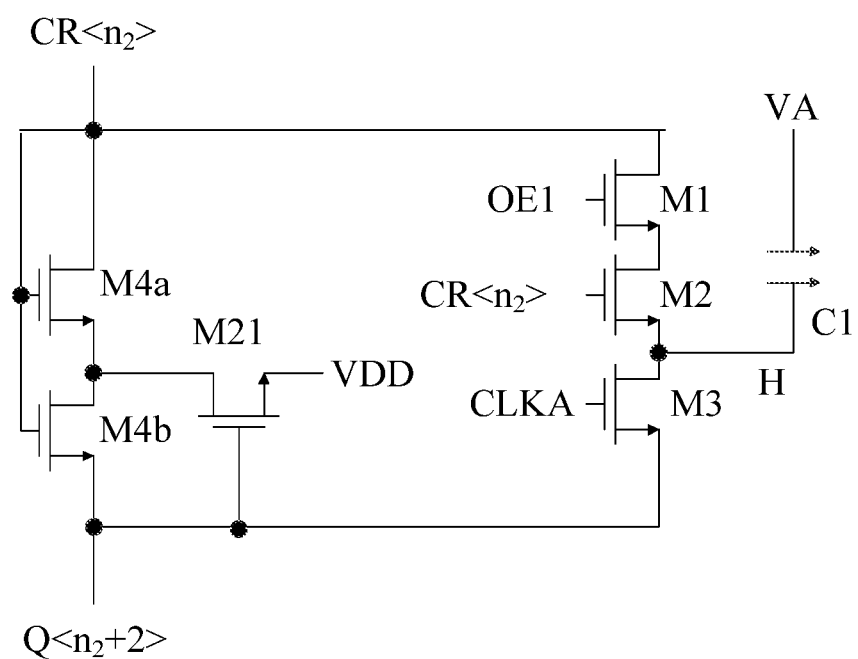
FIG. 10E is a circuit structure diagram of yet another blanking input circuit and yet another display input circuit provided by some other embodiments of the present disclosure.

FIG. 9 is a schematic block diagram of a gate driving circuit provided by some embodiments of the present disclosure; FIG. 10A is a circuit structure diagram of a blanking input circuit and a display input circuit provided by some embodiments of the present disclosure; FIG. 10B is a circuit structure diagram of another blanking input circuit and another display input circuit provided by some embodiments of the present disclosure; FIG. 10C is a circuit structure diagram of a blanking input circuit and a display input circuit provided by some other embodiments of the present disclosure; FIG. 10D is a circuit structure diagram of another blanking input circuit and another display input circuit provided by some other embodiments of the present disclosure; FIG. 10E is a circuit structure diagram of yet another blanking input circuit and yet another display input circuit provided by some other embodiments of the present disclosure.

For example, as shown in FIG. 9, a gate driving circuit 20 includes a plurality of cascaded shift register units (e.g., A1, A2, A3, A4, and the like). The number of the plurality of shift register units is not limited and can be determined according to actual requirements. For example, the shift register unit adopts the shift register unit 10 described in any one of the embodiments of the present disclosure. For example, in the gate driving circuit 20, a portion of or all of the shift register units may adopt the shift register unit 10 of any one of the embodiments of the present disclosure. For example, the gate driving circuit 20 can be directly integrated on an array substrate of a display device by a process similar to that of the thin film transistor to achieve a progressive scan driving function. First pixel signal output ends OT1 of the shift register units are respectively connected with a plurality of first gate lines (for example, G11, G21, G31, G41, etc.) in one-to-one correspondence manner; and second pixel signal output ends OT2 of the shift register units are respectively connected with a plurality of second gate lines (for example, G12, G22, G32, G42, etc.) in one-to-one correspondence manner.

For example, each shift register unit includes a display input signal end STU2, a first clock signal end CLKA (i.e., a blanking input signal end STU1), a first compensation control signal end OE1, a second compensation control signal end OE2, a first output clock signal end CLKD, a second output clock signal end CLKE, a display reset signal end STD, a shift signal output end CR, a first pixel signal output end OT1, a second pixel signal output end OT2, and the like.

For example, as shown in FIG. 9, the gate driving circuit 20 further includes a first sub-clock signal line CLK_1, a second sub-clock signal line CLK_2, a third sub-clock signal line CLK_3, and a fourth sub-clock signal line CLK_4. The connection manner of each stage shift register unit with the above-mentioned respective sub-clock signal lines is as follows and so on.

For example, as shown in FIG. 9, a first output clock signal end CLKD of a $(4n_1-3)$-th stage shift register unit (for example, a first stage shift register unit A1) is connected with the first sub-clock signal line CLK_1; a first output clock signal end CLKD of a $(4n_1-2)$-th stage shift register unit (for example, a second stage shift register unit A2) is connected with the second sub-clock signal line CLK_2; a first output clock signal end CLKD of a $(4n_1-1)$-th stage shift register unit (for example, a third stage shift register unit A3) is connected with the third sub-clock signal line CLK_3; a first output clock signal end CLKD of a $(4n_1)$-th stage shift register unit (for example, a fourth stage shift register unit A4) is connected with the fourth sub-clock signal line CLK_4; $n_1$ is an integer larger than zero.

For example, as shown in FIG. 9, the gate driving circuit 20 further includes a fifth sub-clock signal line CLK_5, a sixth sub-clock signal line CLK_6, a seventh sub-clock signal line CLK_7, an eighth sub-clock signal line CLK_8. The connection manner of each stage shift register unit with the above-mentioned respective sub-clock signal lines is as follows and so on.

For example, as shown in FIG. 9, a second output clock signal end CLKE of the $(4n_1-3)$-th stage shift register unit (for example, the first stage shift register unit A1) is connected with the fifth sub-clock signal line CLK_5; a second output clock signal end CLKE of the $(4n_1-2)$-th stage shift register unit (for example, the second stage shift register unit A2) is connected with the sixth sub-clock signal line CLK_6; a second output clock signal end CLKE of the $(4n_1-1)$-th stage shift register unit (for example, the third stage shift register unit A3) is connected with the seventh sub-clock signal line CLK_7; a second output clock signal end CLKE of the $(4n_1)$-th stage shift register unit (for example, the fourth stage shift register unit A4) is connected with the eighth sub-clock signal line CLK_8.

For example, as shown in FIG. 9, the gate driving circuit 20 further includes a blanking input clock signal line CLK_9, and the blanking input clock signal line CLK_9 is configured to be connected with the first clock signal ends CLKA (i.e., the blanking input signal end STU1) of the respective stages of the shift register units (for example, the first stage shift register unit A1, the second stage shift register unit A2, the third stage shift register unit A3, and the fourth stage shift register unit A4).

For example, as shown in FIG. 9 and FIG. 10A to FIG. 10E, in some examples, the blanking input signal end STU1 of each stage shift register unit is connected to the first clock signal end CLKA, i.e., the first clock signal end CLKA is equivalent to the blanking input signal end STU1 of each stage shift register unit. In addition to the last three stages of the shift register units, a display reset signal end STD of a $(n_2)$-th stage shift register unit 10 (for example, the first stage shift register unit A1) is connected with a shift signal output end CR of a $(n_2+3)$-th stage shift register unit 10 (for example, the fourth stage shift register unit A4). For example, in a case where the gate driving circuit 20 includes only four shift register units, a display reset signal end STD of the first stage shift register unit A1 is connected with a shift signal output end CR of the fourth stage shift register unit A4, a display reset signal end STD of the second stage shift register unit A2, a display reset signal end STD of the third stage shift register unit A3, and a display reset signal end STD of the fourth stage shift register unit A4 may be respectively connected with a plurality of individually disposed reset signal lines. In addition to the first stage shift register unit A1 and the second stage shift register unit A2, a display input signal end STU2 of a $(n_2+2)$-th stage shift register unit (for example, the third stage shift register unit A3) is connected with a shift signal output end CR of a $(n_2)$-th stage shift register unit (for example, the first stage shift register unit A1), and n2 is an integer larger than zero. For example, both a display input signal end STU2 of the first stage shift register unit A1 and a display input signal end STU2 of the second stage shift register unit A2 are connected to an input signal line STU to, for example, receive a trigger signal STV.

For example, as shown in FIG. 9 and FIG. 10A, a first compensation control signal end OE1 of each stage shift register unit receives an external random signal, and a second compensation control signal end OE2 of the $(n_2+2)$-th stage shift register unit (for example, the third stage shift register unit A3) is connected to a shift signal output end CR of the $(n_2+2)$-th stage shift register unit (for example, the third stage shift register unit A3), i.e., a signal output by the shift signal output end of the $(n_2+2)$-th stage shift register unit serves as the second compensation control signal of the $(n_2+2)$-th stage shift register unit. In addition to the first stage shift register unit A1 and the second stage shift register unit A2, a display input signal ends STU2 of the $(n_2+2)$-th stage shift register unit (for example, the third stage shift register unit A3) is connected with a shift signal output end CR of the $(n_2)$-th stage shift register unit (for example, the first stage shift register unit A1), and n2 is an integer larger than zero.

For example, as shown in FIG. 10B, in some examples, the first compensation control signal end OE1 of each stage shift register unit receives an external random signal, and in addition to the first stage shift register unit A1 and the second stage shift register unit A2, the second compensation control signal end OE2 of the $(n_2+2)$-th stage shift register unit (for example, the third stage shift register unit A3) is connected to the shift signal output end CR of the $(n_2)$-th stage shift register unit (for example, the first stage shift register unit A1), i.e., a signal output by the shift signal output end of the $(n_2)$-th stage shift register unit serves as the second compensation control signal of the $(n_2+2)$-th stage shift register unit. The display input signal end STU2 of the $(n_2+2)$-th stage shift register unit (for example, the third stage shift register unit A3) is connected with the shift signal output end CR of the $(n_2)$-th stage shift register unit (for example, the first stage shift register unit A1), and n2 is an integer larger than zero.

For example, as shown in FIG. 10C, in some examples, the first compensation control signal end OE1 of each stage shift register unit receives an external random signal, and in addition to the last three stages of the shift register units, a shift signal output end CR of the $(n_2+3)$-th stage shift register unit (for example, the fourth stage shift register unit A4) is connected to the second compensation control signal end OE2 of the $(n_2)$-th stage shift register unit (for example, the first stage shift register unit A1), i.e., a signal output by the shift signal output end of the $(n_2+3)$-th stage shift register unit serves as the second compensation control signal of the $(n_2)$-th stage shift register unit. The display input signal end STU2 of the $(n_2+2)$-th stage shift register unit (for example, the third stage shift register unit A3) is connected with the shift signal output end CR of the $(n_2)$-th stage shift register unit (for example, the first stage shift register unit A1), and n2 is an integer larger than zero.

For example, as shown in FIG. 10D, the second compensation control signal end OE2 of each stage shift register unit receives an external random signal, and in addition to the first stage shift register unit A1 and the second stage shift register unit A2, a first compensation control signal end OE1 of the $(n_2+2)$-th stage shift register unit (for example, the third stage shift register unit A3) is connected to the shift signal output end CR of the $(n_2)$-th stage shift register unit (for example, the first stage shift register unit A1), i.e., a signal output by the shift signal output end of the $(n_2)$-th stage shift register unit serves as the first compensation control signal of the $(n_2+2)$-th stage shift register unit. The display input signal ends STU2 of the $(n_2+2)$-th stage shift register unit (for example, the third stage shift register unit A3) is connected with the shift signal output end CR of the ($n_2$)-th stage shift register unit (for example, the first stage shift register unit A1), and n2 is an integer larger than zero.

For example, as shown in FIG. 10E, in some examples, in addition to the first stage shift register unit A1 and the second stage shift register unit A2, the shift signal output end CR of the ($n_2$)-th stage shift register unit (for example, the first stage shift register unit A1) is connected to the second compensation control signal end OE2 of the ($n_2$+2)-th stage shift register unit (for example, the third stage shift register unit A3), i.e., a signal output by the shift signal output end of the ($n_2$)-th stage shift register unit serves as the second compensation control signal of the ($n_2$+2)-th stage shift register unit. The shift signal output end CR of the ($n_2$)-th stage shift register unit (for example, the first stage shift register unit A1) is connected to the blanking control signal end BP and the display control signal end DP of the ($n_2$+2)-th stage shift register unit (for example, the third stage shift register unit A3), i.e., a signal output by the shift signal output end for the ($n_2$)-th stage shift register unit also serves as the blanking control signal and the display control signal of the ($n_2$+2)-th stage shift register unit. The display input signal ends STU2 of the ($n_2$+2)-th stage shift register unit (for example, the third stage shift register unit A3) is also connected with the shift signal output end CR of the ($n_2$)-th stage shift register unit (for example, the first stage shift register unit A1), and $n_2$ is an integer larger than zero.

For example, as shown in FIG. 10E, in a case where the shift signal output end CR of the ($n_2$)-th stage shift register unit is connected to the blanking control signal end BP of the ($n_2$+2)-th stage shift register unit, each shift register unit can also include a second leakage prevention circuit, the second leakage prevention circuit can include a fifth leakage prevention transistor M4b and a sixth leakage prevention transistor M21. The second leakage prevention circuit is configured to prevent charges at the first node Q from leaking via the fourth transistor M4a when the first node Q is at a high level. A gate electrode of the fifth leakage prevention transistor M4b is connected to a gate electrode of the fourth transistor M4a (i.e., the gate electrode of the fifth leakage prevention transistor M4b of the ($n_2$+2)-th stage shift register unit is connected to the shift signal output end CR of the ($n_2$)-th stage shift register unit), a first electrode of the fifth leakage prevention transistor M4b is connected to a second electrode of the fourth transistor M4a, and a second electrode of the fifth leakage prevention transistor M4b is connected to the first node Q. A gate electrode of the sixth leakage prevention transistor M21 is connected to the first node Q, a first electrode of the sixth leakage prevention transistor M21 is connected to the sixth voltage end VDD, and a second electrode of the sixth leakage prevention transistor M21 is connected to the first electrode of the fifth leakage prevention transistor M4b. Similarly, a principle of using the second leakage prevention transistor to prevent leakage of electricity is similar with a principle of using the first leakage prevention transistor to prevent leakage of electricity, and will not be repeated herein.

For example, the gate driving circuit 20 can also include a timing controller T-CON, and for example, the timing controller T-CON is configured to provide the aforementioned various clock signals to the respective stages of the shift register units, and the timing controller T-CON can also be configured to provide the trigger signal and the reset signal. It should be noted that, the phase relationships among the plurality of clock signals provided by the timing controller T-CON may be determined according to actual requirements. In different examples, more clock signals can be provided according to the different configurations. For example, the gate driving circuit 20 further includes a plurality of voltage lines to provide a plurality of voltage signals to the respective stages of the shift register units.

For example, in a case where a display panel is driven by the gate driving circuit 20, the gate driving circuit 20 may be disposed at one side of the display panel. Of course, the gate driving circuits 20 may also be disposed on both sides of the display panel to achieve bilateral driving, but the embodiments of the present disclosure does not limit the manner in which the gate driving circuit 20 is disposed. For example, a gate driving circuit 20 may be disposed on one side of the display panel for driving odd-row gate lines, while a gate driving circuit 20 may be disposed on the other side of the display panel for driving even-row gate lines.

Figure 11:
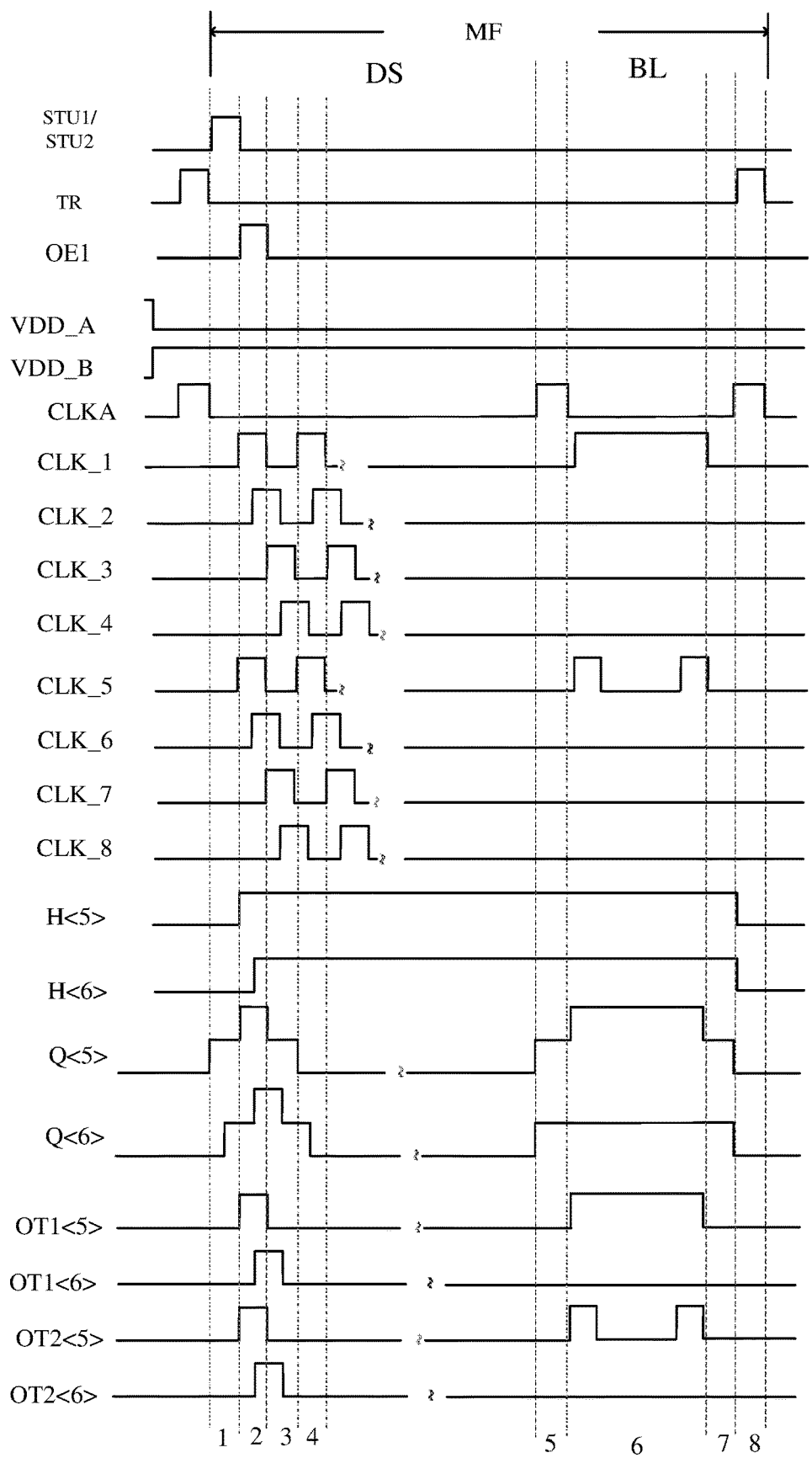
FIG. 11 is a signal timing sequence diagram of a gate driving circuit provided by some embodiments of the present disclosure.

FIG. 11 is a signal timing sequence diagram of a gate driving circuit provided by some embodiments of the present disclosure, the signal timing sequence diagram is the timing sequence of the gate driving circuit 20 as shown in FIG. 9, and the shift register unit in the gate driving circuit 20 is the shift register unit 10 as shown in FIG. 6A. The working principle of the gate driving circuit 20 can refer to the corresponding description of the shift register unit 10 in the embodiments of the present disclosure, and the repeated portions are not be described again.

It should be noted that, in FIG. 11, Q<5> and Q<6> respectively denote a first node Q in a fifth stage shift register unit and a first node Q in a sixth stage shift register unit in the gate driving circuit 20. OT1<5> and OT2<5> respectively denote a first pixel signal output end OT1 and a second pixel signal output end OT2 in the fifth stage shift register unit in the gate driving circuit 20, and OT1<6> and OT2<6> respectively denote a first pixel signal output end OT1 and a second pixel signal output end OT2 in the sixth stage shift register unit in the gate driving circuit 20. MF denotes an M-th frame, and M is a positive integer. DS denotes a display period in one frame, and BL denotes a blanking period in one frame. It should be noted that, because the potential of the first pixel signal output end OT1 in each stage shift register unit and the potential of the shift signal output end CR in each stage shift register unit are the same, and therefore, the shift signal output end CR is not shown in FIG. 11. It is noteworthy that the signal levels in the signal timing sequence diagrams shown in FIG. 8 and FIG. 11 are only schematic and do not represent actual values of a level.

For example, during the display period DS, the shift register unit 10 outputs the scan drive signals row by row to the plurality of rows of gate lines until a scan drive signal is output to the last row of gate lines, thereby completing the display of one frame. For example, in the M-th frame, detection compensation need to be performed on sub-pixel units in a n-th row, and the sub-pixel units in the n-th row are connected with the output end of the n-th stage shift register unit 10, and thus, during the blanking period BL, the first pixel signal output end OT1 of the n-th stage shift register unit 10 outputs a high level signal, such that detection is performed on the sub-pixel units in the n-th row.

For example, as shown in FIG. 9, FIG. 10A and FIG. 11, if in the M-th frame, sub-pixel units in a fifth row need to be detected, the fifth row of the sub-pixel units corresponds to the fifth stage shift register unit. Within the M-th frame, the external control circuit outputs the signal, which is output by the shift signal output end CR of the fifth stage shift register unit, to the first compensation control signal end OE1 of each stage shift register unit, i.e., a waveform pulse width of the first compensation control signal provided by the external control circuit is the same as a waveform pulse width of the signal output by the shift signal output end CR of the fifth stage shift register unit. Because in the examples shown in FIG. 9 and FIG. 10A, the second compensation control signal end OE2 of the $(n_2)$-th stage shift register unit is connected to the shift signal output end CR of the $(n_2)$-th stage shift register unit, and thus, during the second phase of the display period DS, in a case where the shift signal output end CR of the fifth stage shift register unit outputs a high level signal, as shown in FIG. 6A, both the first transistor M1 and the second transistor M2 in the charging sub-circuit 110 of the fifth stage shift register unit are turned on, and thus, the sixth voltage provided by the sixth voltage end VDD is written into the control node H of the fifth stage shift register unit to pull the control node H of the fifth stage shift register unit up to a high level.

For example, as shown in FIG. 11, waveforms of the first sub-clock signal CLK_1, the second sub-clock signal CLK_2, the third sub-clock signal CLK_3, and the fourth sub-clock signal CLK_4 in the display period of one frame are sequentially overlapped by 50% of the effective pulse width, and waveforms of the output signals OT1<1>, OT1<2>, OT1<3>, and OT1<4> of the first pixel signal output ends OT1 of the first stage shift register unit to the fourth stage shift register unit A1-A4 in the display period of one frame are sequentially overlapped by 50% of the effective pulse width. Waveforms of the fifth sub-clock signal CLK_5, the sixth sub-clock signal CLK_6, the seventh sub-clock signal CLK_7, the eighth sub-clock signal CLK_8 in the display period of one frame are also sequentially overlapped by 50% of the effective pulse width, and waveforms of the output signals OT2<1>, OT2<2>, OT2<3>, and OT2<4> of the second pixel signal output ends OT2 of the first stage shift register unit to the fourth stage shift register unit A1-A4 in the display period of one frame are also sequentially overlapped by 50% of the effective pulse width. The waveforms of the output signals of the gate driving circuit 20 in the display period overlap, so that the pre-charging function can be achieved, the charging efficiency can be improved, and the overall charging time of the pixel circuit (i.e., the time of the display period in one frame) can be shortened, which is beneficial to achieve a high refresh rate. In this case, the pixels located in the odd rows and the pixels located in the even rows on the display panel may be respectively connected to different data lines, and therefore, when two adjacent rows of pixel units are simultaneously charged, the adjacent two rows of pixel units may respectively receive corresponding data signals.

It should be noted that, in each embodiment of the present disclosure, the gate driving circuit 20 is not limited to a cascading manner described in FIG. 9, and may have any suitable cascading manner. In a case where the cascading manner or the clock signal is changed, the waveform overlapping portions of the output signals OT1<1>, OT1<2>, OT1<3>, and OT1<4> of the first pixel signal output ends OT1 of the first stage shift register unit to the fourth stage shift register unit A1-A4 in the display period of one frame also change accordingly, and the waveform overlapping portions of the output signals OT2<1>, OT2<2>, OT2<3>, and OT2<4> of the second pixel signal output ends OT2 of the first stage shift register unit to the fourth shift register unit A1-A4 in the display period of one frame also change accordingly, for example, overlapping by 33% or 0% (i.e., non-overlapping), to meet requirements of various applications.

For example, as shown in FIG. 11, because a waveform of a signal output by the first pixel signal output end OT1 of the fifth stage shift register unit and a waveform of a signal output by the first pixel signal output end OT1 of the sixth stage shift register unit overlap with each other, and thus, in the second phase 2, during a process of charging the control node H of the fifth stage shift register unit, in a case where the shift signal output end CR of the sixth stage shift register unit outputs a high level signal, both the first transistor M1 and the second transistor M2 in the charging sub-circuit 110 of the sixth stage shift register unit are turned on, and thus, the sixth voltage provided by the sixth voltage end VDD is written into the control node H of the sixth stage shift register unit, to pull the control node H of the sixth stage shift register unit up to a high level. In a case where the first compensation control signal is at a low level, the potentials of the control node H of the fifth stage shift register unit and the control node H of the sixth stage shift register unit can be maintained until the blanking period BL.

For example, as shown in FIG. 6A and FIG. 11, in the fifth phase of the blanking period BL, the first clock signal CLKA is a high level signal, so that the third transistors M3 of all stages of the shift register units are turned on, because both the control node H of the fifth stage shift register unit and the control node H of the sixth stage shift register unit are at a high level, and thus, the first node Q of the fifth stage shift register unit and the first node Q of the sixth stage shift register unit are charged to a high level.

For example, in the sixth phase of the blanking period BL, the first sub-clock signal line CLK_1 (for providing the first output clock signal CLKD) connected with the fifth stage shift register unit provides a high-level signal, and the fifth sub-clock signal line CLK_5 (for providing the second output clock signal CLKE) connected with the fifth stage shift register unit provides a pulse signal, and thus, the first pixel signal output end OT1 of the fifth stage shift register unit outputs a high-level signal, the second pixel signal output end OT2 of the fifth stage shift register unit outputs a pulse signal. Thus, within the M-th frame period, the detection of the fifth row of sub-pixel units can be achieved.

However, the second sub-clock signal line CLK_2 (for providing the first output clock signal CLKD) connected with the sixth stage shift register unit provides a low-level signal, and the sixth sub-clock signal line CLK_6 (for providing the second output clock signal CLKE) connected with the sixth stage shift register unit also provides a low-level signal, and thus, both the first pixel signal output end OT1 and the second pixel signal output end OT2 of the sixth stage shift register unit output low-level signals. Thus, within the M-th frame period, the sub-pixel units in the sixth row (which correspond to the sixth stage shift register unit) are not detected.

It should be noted that, when performing random detection compensation, if sub-pixel units in W-th row need to be detected, and the sub-pixels in the W-th row correspond to a W-th stage shift register unit, the first compensation control signal of each stage shift register unit may be changed according to the second compensation control signal of the W-th stage shift register unit to ensure that when the second transistor M2 of the W-th stage shift register unit is turned on, the first transistor M1 of the W-th stage shift register unit is also simultaneously turned on. For example, W is a positive integer. For example, in the example shown in FIG. 10B, when the sub-pixel units of the fifth row need to be detected, because the second compensation control signal end OE2 of the $(n_2+2)$-th stage shift register unit is connected with the shift signal output end CR of the $(n_2)$-th stage shift register unit, then the external control circuit outputs the signal output by the shift signal output end CR of the third stage shift register unit to the first compensation control signal end OE1 of each stage shift register unit. For another example, in the example shown in FIG. 10C, when the sub-pixel units of the fifth row need to be detected, because the shift signal output end CR of the $(n_2+3)$-th stage shift register unit is connected with the second compensation control signal end OE2 of the $(n_2)$-th stage shift register unit, then the external control circuit outputs the signal output by the shift signal output end CR of the eighth stage shift register unit to the first compensation control signal end OE1 of each stage shift register unit.

For example, the related descriptions of other phases in the display period DS and the blanking period BL may refer to the detailed descriptions of the other phases in the display period DS and the blanking period BL in the shift register unit described above, and the repeated descriptions will not be described herein again.

Figure 12:
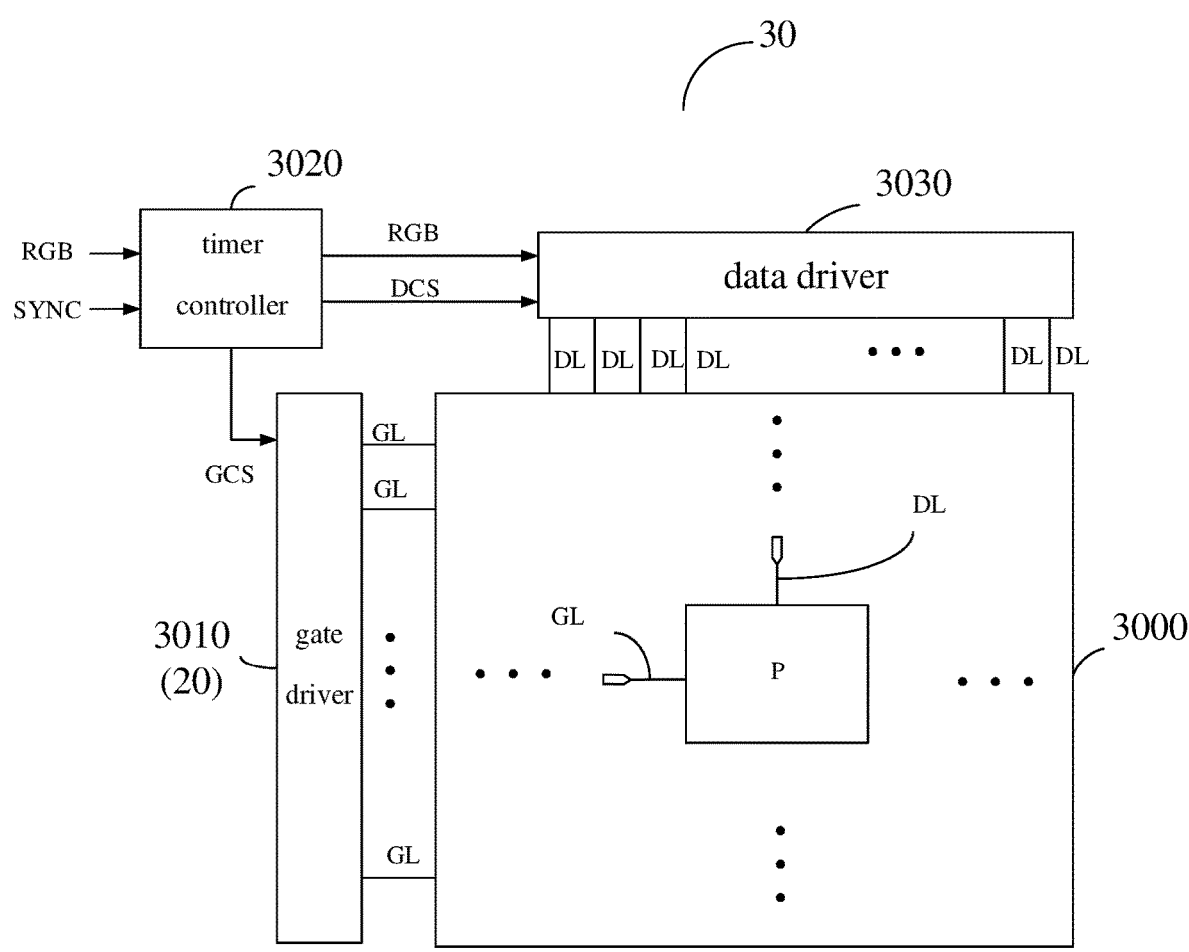
FIG. 12 is a schematic block diagram of a display device provided by some embodiments of the present disclosure.

FIG. 12 is a schematic block diagram of a display device provided by some embodiments of the present disclosure. For example, as shown in FIG. 12, a display device 30 includes a gate driving circuit 20, the gate driving circuit 20 includes a gate driving circuit as described in any one of the embodiments of the present disclosure.

For the technical effects of the display device 30, reference may be made to the corresponding descriptions of the shift register unit 10 and the gate driving circuit 20 in the above embodiments, and details are not described herein again.

For example, the display device 30 in this embodiment may be: a liquid crystal panel, a liquid crystal television, a display, an OLED panel, an OLED television, an OLED display, an electronic paper display device, a mobile phone, a tablet computer, a notebook computer, a digital photo frame, a navigation device, and any product or component that has a display function.

For example, in an example, the display device 30 includes a display panel 3000, a gate driver 3010, a timer controller 3020, and a data driver 3030. The display panel 3000 includes a plurality of pixel units P, and the plurality of pixel units P are defined by a plurality of gate lines GL and a plurality of data lines DL. The gate driver 3010 is configured to drive the plurality of gate lines GL; the data driver 3030 is configured to drive the plurality of data lines DL; and the timing controller 3020 is configured to process image data RGB input from outside of the display device 30, provide the processed image data RGB to the data driver 3030 and output a scan control signal GCS and a data control signal DCS to the gate driver 3010 and the data driver 3030, so as to control the gate driver 3010 and the data driver 3030.

For example, the gate driver 3010 includes the gate driving circuit 20 provided in any one of the above embodiments. The first pixel signal output ends OT1 of the plurality of shift register units 10 in the gate driving circuit 20 are correspondingly connected with the plurality of gate lines GL. The first pixel signal output ends OT1 of the respective stages of the shift register units 10 in the gate driving circuit 20 sequentially output scan drive signals to the plurality of gate lines GL, so as to achieve progressively scanning the plurality of pixel units P in the display panel 3000 during the display period and achieve random compensation detection during the blanking period. For example, the gate driver 3010 can be implemented as a semiconductor chip or may be integrated in the display panel 3000 to constitute a GOA circuit.

For example, the data driver 3030 provides the converted data signals to the plurality of data lines DL. For example, the data driver 3030 can be implemented as a semiconductor chip.

For example, the timer controller 3020 processes the image data RGB input from the outside to match a size and resolution of the display panel 3000, and then provides the processed image data to the data driver 3030. The timer controller 3020 generates a plurality of scan control signals GCS and a plurality of data control signals DCS using synchronization signals (for example, a dot clock DCLK, a data enable signal DE, a horizontal synchronization signal Hsync, and a vertical synchronization signal Vsync) input from the outside of the display device 30. The timer controller 3020 provides the generated scan control signal GCS and data control signal DCS to the gate driver 3010 and the data driver 3030, respectively, for controlling the gate driver 3010 and the data driver 3030.

It should be noted that the display device 30 may further include other components, such as a signal decoding circuit, a voltage conversion circuit, etc., and these components may adopt for example, the existing conventional components, and may not be described in detail herein.

At least some embodiments of the present disclosure also provide a driving method of a shift register unit, and the driving method can be used to drive the shift register unit provided by any one of the embodiments of the present disclosure.

Figure 13:
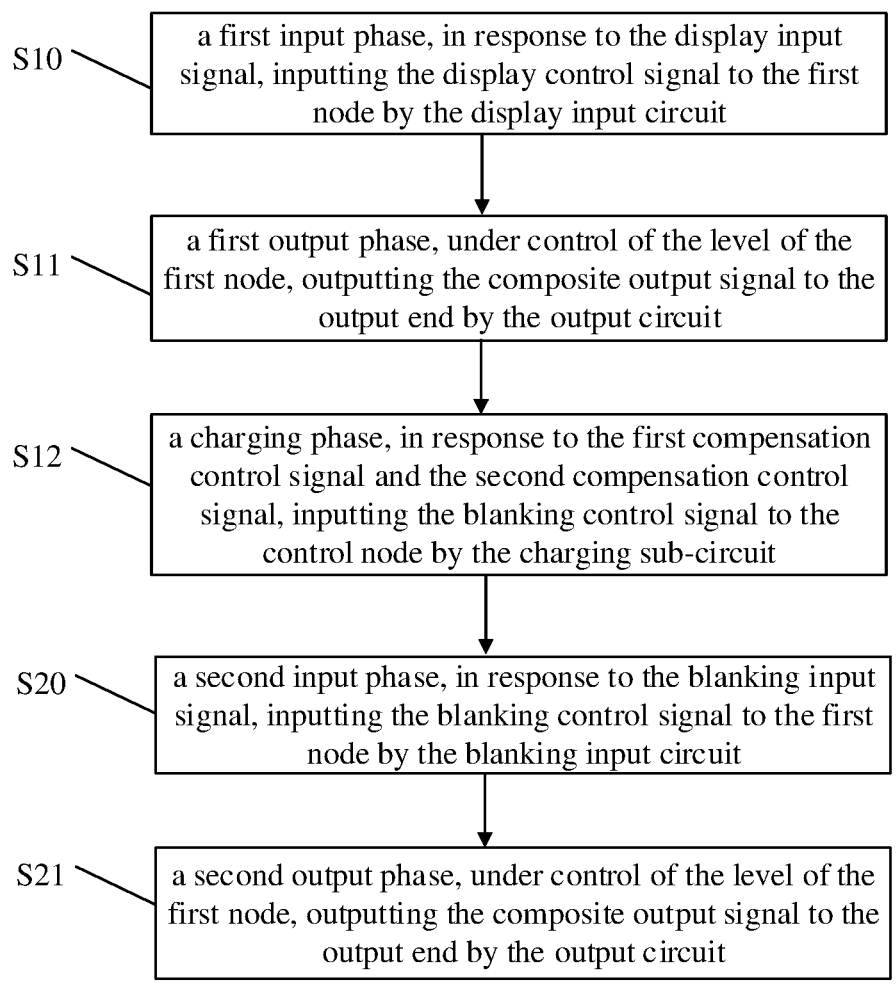
FIG. 13 is a flow chart of a driving method of a shift register provided by some embodiments of the present disclosure.

FIG. 13 is a flow chart of a driving method of a shift register provided by some embodiments of the present disclosure. The driving method can include a display period and a blanking period that are used for one frame. As shown in FIG. 13, the driving method can include the following operations:

during the display period of one frame, including:

S10: a first input phase, in response to the display input signal, inputting the display control signal to the first node by the display input circuit;

S11: a first output phase, under control of the level of the first node, outputting the composite output signal to the output end by the output circuit;

S12: a charging phase, in response to the first compensation control signal and the second compensation control signal, inputting the blanking control signal to the control node by the charging sub-circuit;

during blanking period of one frame, including:

S20: a second input phase, in response to the blanking input signal, inputting the blanking control signal to the first node by the blanking input circuit;

S21: a second output phase, under control of the level of the first node, outputting the composite output signal to the output end by the output circuit.

For example, in an example, in a case where the shift register unit 10 includes the third control circuit 700, step S10 further includes: controlling a level of the second node by the third control circuit in response to the second control signal, so as to pull the level of the second node down to a non-working potential.

For example, in some examples, the output end includes a shift signal output end and a first pixel signal output end, and the output circuit includes a first output transistor and a second output transistor. Step S11 can include: under control of the level of the first node, transmitting a display shift signal to the shift signal output end via the first output transistor, transmitting a display output signal to the first pixel signal output end via the second output transistor. The composite output signal includes the display output signal and the display shift signal. For example, the display output signal can used to drive the sub-pixel units in the display panel for display.

It should be noted that, step S11 and step S12 are not in sequential order, step S12 may be performed before step S11; step S12 may be performed after step S11; step S12 and step S11 may be performed at the same time.

For example, in another example, in a case where the shift register unit 10 includes the second control circuit 600, step S20 further includes controlling the level of the second node by the second control circuit in response to the first control signal, to pull the level of the second node down to a non-working potential.

For example, in some examples, step S21 can include: under control of the level of the first node, transmitting a blanking shift signal to the shift signal output end via the first output transistor, transmitting a blanking output signal to the first pixel signal output end via the second output transistor. The composite output signal includes the blanking output signal and the blanking shift signal. For example, the blanking output signal can used to drive the sub-pixel units in the display panel for external compensation.

It should be noted that, in the embodiment of the above shift register unit, the first output signal may include the display shift signal and the blanking shift signal, and the second output signal includes the display output signal and the blanking output signal. As shown in FIG. 8, the display output signal may be a signal output by the first pixel signal output end during the display period, and the display shift signal may be a signal output by the shift signal output end during the display period, the display shift signal and the display output signal may be the same, and the display output signal may be, for example, a pulse signal; the blanking output signal may be a signal output by the first pixel signal output end during the blanking period, and the blanking shift signal may be a signal output by the shift signal output end during the blanking period, the blanking shift signal and the blanking output signal may also be the same, and the blanking output signal may be, for example, a high level signal.

For example, in the display period, after step S12, the driving method can further include: a display reset phase, resetting the first node under control of the display reset signal; and performing noise reduction on the first node, the shift signal output end, the first pixel signal output end, and the second pixel signal output end by the noise reduction circuit under the control of the level of the second node.

For example, during the blanking period, after step S21, the driving method can further include: a blanking reset phase, resetting the first node and the control node under control of the blanking reset signal and the blanking input signal.

It should be noted that the detailed descriptions and the technical effects of the driving method can refer to the corresponding descriptions of the shift register unit 10 and the gate driving circuit 20 in the embodiments of the present disclosure, and are not be repeated herein again.

For the present disclosure, the following statements should be noted:

(1) The accompanying drawings of the embodiments of the present disclosure only involve the structure(s) in connection with the embodiment(s) of the present disclosure, and other structures can refer to general designs.

(2) In case of no conflict, the embodiments of the present disclosure and the features of the embodiments of the present disclosure may be combined with each other to obtain new embodiments.

What have been described above are only specific implementations of the present disclosure, the protection scope of the present disclosure is not limited thereto, and the protection scope of the present disclosure should be based on the protection scope of the claims.

What is claimed is:

1. A shift register unit, comprising: a blanking input circuit, a display input circuit, and an output circuit,
    wherein the blanking input circuit is configured to input a blanking control signal to a first node during a blanking period in response to a blanking input signal, the blanking input circuit comprises a charging sub-circuit, the charging sub-circuit is configured to input the blanking control signal to a control node in response to a first compensation control signal and a second compensation control signal;
    the display input circuit is configured to input a display control signal to the first node during a display period in response to a display input signal; and
    the output circuit is configured to output a composite output signal to an output end under control of a level of the first node.

2. The shift register unit according to claim 1, wherein one of the first compensation control signal and the second compensation control signal is a random signal.

3. The shift register unit according to claim 1, wherein the charging sub-circuit comprises a first transistor and a second transistor,
    a gate electrode of the first transistor is configured to receive the first compensation control signal, a first electrode of the first transistor is configured to be connected with a blanking control signal end to receive the blanking control signal, and a second electrode of the first transistor is configured to be connected with a first electrode of the second transistor,
    a second electrode of the second transistor is configured to be connected with the control node, and a gate electrode of the second transistor is configured to receive the second compensation control signal.

4. The shift register unit according to claim 1, wherein the blanking input circuit further comprises:
    a storage sub-circuit configured to store the blanking control signal that is input by the charging sub-circuit; and
    an isolation sub-circuit configured to input the blanking control signal to the first node under control of the blanking input signal.

5. The shift register unit according to claim 4, wherein the storage sub-circuit comprises a first capacitor, a first electrode of the first capacitor is configured to be connected with the control node, and a second electrode of the first capacitor is configured to be connected with a first voltage end to receive a first voltage;
    the isolation sub-circuit comprises a third transistor, a gate electrode of the third transistor is configured to be connected with a blanking input signal end to receive the blanking input signal, a first electrode of the third transistor is configured to be connected with the control node, and a second electrode of the third transistor is configured to be connected with the first node.

6. The shift register unit according to claim 1, wherein the display input circuit comprises a fourth transistor,
    a gate electrode of the fourth transistor is connected with a display input signal end to receive the display input signal, a first electrode of the fourth transistor is connected with a display control signal end to receive the display control signal, and a second electrode of the fourth transistor is connected with the first node.

7. The shift register unit according to claim 1, wherein the output end comprises a shift signal output end and a first pixel signal output end, the output circuit comprises a first output transistor, a second output transistor, and a second capacitor;

a gate electrode of the first output transistor is connected with the first node, a first electrode of the first output transistor is connected with a first output clock signal end to receive a first output clock signal, and a second electrode of the first output transistor is connected with the shift signal output end;

a gate electrode of the second output transistor is connected with the first node, a first electrode of the second output transistor is connected with the first output clock signal end to receive the first output clock signal, and a second electrode of the second output transistor is connected with the first pixel signal output end;

a first electrode of the second capacitor is connected with the first node, and a second electrode of the second capacitor is connected with the second electrode of the first output transistor; and the first output clock signal is transmitted to the shift signal output end through the first output transistor to be as a first output signal, the first output clock signal is transmitted to the first pixel signal output end through the second output transistor to be as a second output signal, and the composite output signal comprises the first output signal and the second output signal.

8. The shift register unit according to claim 7, wherein the output end further comprises a second pixel signal output end, and the output circuit further comprises a third output transistor, a gate electrode of the third output transistor is connected with the first node, a first electrode of the third output transistor is connected with a second output clock signal end to receive a second output clock signal, and a second electrode of the third output transistor is connected with the second pixel signal output end; and the second output clock signal is transmitted to the second pixel signal output end through the third output transistor to be as a third output signal, and the composite output signal further comprises the third output signal.

9. The shift register unit according to claim 1, further comprising a noise reduction circuit, and a first control circuit, wherein the noise reduction circuit is configured to perform noise reduction on the first node and the output end under control of a level of a second node; and the first control circuit is configured to control the level of the second node under control of the level of the first node.

10. The shift register unit according to claim 9, wherein the first control circuit comprises a fifth transistor, a sixth transistor, and a seventh transistor;

a gate electrode of the fifth transistor is connected with the first node, a first electrode of the fifth transistor is connected with the second node, and a second electrode of the fifth transistor is connected with a second voltage end to receive a second voltage;

a gate electrode of the sixth transistor is connected with a first electrode of the sixth transistor and is configured to be connected with a third voltage end to receive a third voltage, and a second electrode of the sixth transistor is connected with the second node; and a gate electrode of the seventh transistor is connected with a first electrode of the seventh transistor and is configured to be connected with a fourth voltage end to receive a fourth voltage, and a second electrode of the seventh transistor is connected with the second node.

11. The shift register unit according to claim 9, wherein the output end comprises a shift signal output end and a first pixel signal output end, the noise reduction circuit comprises a first noise reduction transistor, a second noise reduction transistor, and a third noise reduction transistor;

a gate electrode of the first noise reduction transistor is connected with the second node, a first electrode of the first noise reduction transistor is connected with the first node, and a second electrode of the first noise reduction transistor is connected with a second voltage end to receive a second voltage;

a gate electrode of the second noise reduction transistor is connected with the second node, a first electrode of the second noise reduction transistor is connected with the shift signal output end, and a second electrode of the second noise reduction transistor is connected with the second voltage end to receive the second voltage; and a gate electrode of the third noise reduction transistor is connected with the second node, a first electrode of the third noise reduction transistor is connected with the first pixel signal output end, and a second electrode of the third noise reduction transistor is connected with a fifth voltage end to receive a fifth voltage.

12. The shift register unit according to claim 9, further comprising a second control circuit; wherein the second control circuit is configured to control the level of the second node in response to a first control signal.

13. The shift register unit according to claim 1, further comprising a blanking reset circuit and a display reset circuit, wherein the blanking reset circuit is configured to reset the first node in response to a blanking reset signal; and the display reset circuit is configured to reset the first node in response to a display reset signal.

14. A gate driving circuit comprising a plurality of cascaded shift register units, wherein each shift register unit of the plurality of cascaded shift register unit comprises: a blanking input circuit, a display input circuit, and an output circuit;

the blanking input circuit is configured to input a blanking control signal to a first node during a blanking period in response to a blanking input signal, the blanking input circuit comprises a charging sub-circuit, the charging sub-circuit is configured to input the blanking control signal to a control node in response to a first compensation control signal and a second compensation control signal;

the display input circuit is configured to input a display control signal to the first node during a display period in response to a display input signal; and the output circuit is configured to output a composite output signal to an output end under control of a level of the first node.

15. The gate driving circuit according to claim 14, further comprising a first sub-clock signal line, a second sub-clock signal line, a third sub-clock signal line, and a fourth sub-clock signal line, wherein each shift register units comprises a first output clock signal end, a first output clock signal end of a $(4n_1-3)$-th stage shift register unit is connected with the first sub-clock signal line;

a first output clock signal end of a $(4n_1-2)$-th stage shift register unit is connected with the second sub-clock signal line;

a first output clock signal end of a $(4n_1-1)$-th stage shift register unit is connected with the third sub-clock signal line;

a first output clock signal end of a $(4n_1)$-th stage shift register unit is connected with the fourth sub-clock signal line; and $n_1$ is an integer larger than zero.

16. The gate driving circuit according to claim 14, wherein each shift register unit further comprises a display input signal end and a shift signal output end, a display input signal end of a $(n_2+2)$-th stage shift register unit is connected with a shift signal output end of a $n_2$-th stage shift register unit, and $n_2$ is an integer larger than zero.

17. The gate driving circuit according to claim 16, wherein a signal outputted by the shift signal output end of the $n_2$-th stage shift register unit serves as a second compensation control signal of the $(n_2+2)$-th stage shift register unit; or a signal outputted by a shift signal output end of a $(n_2+3)$-th stage shift register unit serves as a second compensation control signal of the $n_2$-th stag shift register unit; or a signal outputted by the shift signal output end of the $n_2$-th stage shift register unit serves as a second compensation control signal of the $n_2$-th stage shift register unit; or a signal outputted by the shift signal output end of the $n_2$-th stage shift register unit serves as a second compensation control signal of the $(n_2+2)$-th stage shift register unit, and the signal outputted by the shift signal output end of the $n_2$-th stage shift register unit also serves as a blanking control signal of the $(n_2+2)$-th stage shift register unit.

18. The gate driving circuit according to claim 14, further comprising a blanking input clock signal line, wherein each shift register unit further comprises a blanking input signal end, a blanking input signal end of each stage shift register unit is connected with the blanking input clock signal line.

19. A display device comprising a gate driving circuit according to claim 14.

20. A driving method for a shift register unit, wherein the shift register unit comprises: a blanking input circuit, a display input circuit, and an output circuit;

the blanking input circuit is configured to input a blanking control signal to a first node during a blanking period in response to a blanking input signal, the blanking input circuit comprises a charging sub-circuit, the charging sub-circuit is configured to input the blanking control signal to a control node in response to a first compensation control signal and a second compensation control signal;

the display input circuit is configured to input a display control signal to the first node during a display period in response to a display input signal; and the output circuit is configured to output a composite output signal to an output end under control of a level of the first node, and the driving method comprises a display period and a blanking period for one frame:

the display period comprising:

a first input phase, in response to the display input signal, inputting the display control signal to the first node by the display input circuit;

a first output phase, under control of the level of the first node, outputting the composite output signal to the output end by the output circuit;

a charging phase, in response to the first compensation control signal and the second compensation control signal, inputting the blanking control signal to the control node by the charging sub-circuit;

the blanking period comprising:

a second input phase, in response to the blanking input signal, inputting the blanking control signal to the first node by the blanking input circuit;

a second output phase, under control of the level of the first node, outputting the composite output signal to the output end by the output circuit.

* * * * *